US012628467B2

(12) United States Patent
Dallesasse et al.

(10) Patent No.: US 12,628,467 B2
(45) Date of Patent: May 12, 2026

(54) HETEROGENEOUS CHIP INTEGRATION OF III-NITRIDE-BASED MATERIALS FOR OPTOELECTRONIC DEVICE ARRAYS IN THE VISIBLE AND ULTRAVIOLET

(71) Applicant: THE BOARD OF TRUSTEES OF THE UNIVERSITY OF ILLINOIS, Urbana, IL (US)

(72) Inventors: John Michael Dallesasse, Geneva, IL (US); John A. Carlson, Westlake Village, CA (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 1003 days.

(21) Appl. No.: 17/680,495

(22) Filed: Feb. 25, 2022

(65) Prior Publication Data

US 2022/0278073 A1    Sep. 1, 2022

Related U.S. Application Data

(60) Provisional application No. 63/185,800, filed on May 7, 2021, provisional application No. 63/154,399, filed on Feb. 26, 2021.

(51) Int. Cl.
H10H 20/01 (2025.01)
H10P 72/70 (2026.01)
(Continued)

(52) U.S. Cl.
CPC ...... H10H 20/018 (2025.01); H10H 20/0133 (2025.01); H10P 72/74 (2026.01);
(Continued)

(58) Field of Classification Search
CPC .. H10H 20/825; H10H 20/856; H10H 20/857; H10H 20/01; H10H 20/01335
See application file for complete search history.

(56) References Cited

U.S. PATENT DOCUMENTS 6,015,719 A    1/2000  Kish, Jr. et al.
6,514,782 B1   2/2003  Wierer, Jr. et al.
(Continued)

FOREIGN PATENT DOCUMENTS

EP    2705472 B1    4/2019
KR    102080217 B1   2/2020

OTHER PUBLICATIONS

Matsuo et al. Comparison of GaN growth processes on GaAs(111)A and (111)B substrates studied by ab initio calculation, Journal of Crystal Growth, vols. 237-239, Part 2. (Year: 2002).*
(Continued)

*Primary Examiner* — Yara B Green
*Assistant Examiner* — Seth D Lawson
(74) *Attorney, Agent, or Firm* — Guntin & Gust, PLC; Kenneth S. Kwan

(57) ABSTRACT

Aspects of the subject disclosure may include, for example, bonding III-Nitride epitaxial layer(s) to a carrier wafer, wherein the III-Nitride epitaxial layer(s) are grown on a non-native substrate, after the bonding, removing at least a portion of the non-native substrate from the III-Nitride epitaxial layer(s), processing the III-Nitride epitaxial layer (s) to derive an array of III-Nitride islands, establishing a metal layer over the array of III-Nitride islands, resulting in an array of metal-coated III-Nitride islands, arranging the carrier wafer relative to a host wafer to position the array of metal-coated III-Nitride islands on a surface of the host wafer, causing the array of metal-coated III-Nitride islands and the surface of the host wafer to eutectically bond, and removing the carrier wafer to yield an integrated arrange-
(Continued)

700    750 ment of III-Nitride islands on the host wafer. Additional embodiments are disclosed.

20 Claims, 22 Drawing Sheets

(51) Int. Cl.
    *H10W 72/00*      (2026.01)
    *H10W 72/30*      (2026.01)

(52) U.S. Cl.
    CPC  *H10W 72/07331* (2026.01); *H10W 72/07336* (2026.01); *H10W 72/07355* (2026.01); *H10W 72/3524* (2026.01)

(56) References Cited

U.S. PATENT DOCUMENTS

| | | |
|---|---|---|
| 8,110,823 B2 | 2/2012 | Bowers |
| 8,138,515 B2 | 3/2012 | Zeng et al. |
| 8,547,036 B2 | 10/2013 | Tran |
| 8,866,149 B2 | 10/2014 | Holder et al. |
| 9,178,100 B2 | 11/2015 | Webster et al. |
| 9,478,583 B2 | 10/2016 | Hu et al. |
| 10,111,305 B2 | 10/2018 | Tran |
| 10,192,857 B2 | 1/2019 | Fiorentino et al. |
| 10,193,627 B1 | 1/2019 | Herman et al. |
| 10,312,661 B2 | 6/2019 | Lambert |
| 10,551,719 B2 | 2/2020 | Kim et al. |
| 2010/0074293 A1 | 3/2010 | Lochmann et al. |
| 2014/0191246 A1 | 7/2014 | Oraw |
| 2017/0179192 A1 | 6/2017 | Zhang et al. |
| 2017/0334711 A1* | 11/2017 | Chang ..................... B81C 3/001 |
| 2018/0052283 A1 | 2/2018 | Krasulick et al. |

OTHER PUBLICATIONS

Carlson et al., Epitaxial Bonding and Transfer Processes for Large-Scale Heterogeneously Integrated Electronic-Photonic Circuitry, 2019 J. Electrochem. Soc. 166 D3158 (Year: 2018).*

Sabine, Reflectivities of Evaporated Metal Films in the Near and Far Ultraviolet, Phys. Rev. 55, 1064 (1939) (Year: 1939).*

Handbook of Optical Constants of Solids. Edward D. Palik, ed., Academic Press, 1985.

Carlson, J.A. et al., "Epitaxial Bonding and Transfer Processes for Large-Scale Heterogeneously Integrated Electronic-Photonic Circuitry", Journal of The Electrochemical Society 166, No. 1:D3158-D3166, 2019.

Ikhmayies, S. , "Phase Diagrams of Al—Si System", in Energy Technology 2019, The Minerals, Metals & Materials Series, Springer, Cham, 2019, 231-237.

Lu, T.J. et al., "Aluminum nitride integrated photonics platform for the ultraviolet to visible spectrum", Optics express 26, No. 9:11147-11160, 2018.

Rajbhandari, S. et al., "A review of gallium nitride LEDs for multi-gigabit-per-second visible light data communications", 2017 Semicond. Sci. Technol 32, No. 02300, 2019.

Rutz, H. et al., "Towards a quantum interface between telecommunication and UV wavelengths: design and classical performance", Applied Physics B 122, No. 1:13, 2016.

* cited by examiner

200

BEFORE                    AFTER

250

300

410

400

High-Reflectivity Mirror

Epitaxial Layer Set
502i

Epitaxial Layers Set
512i

Temporary Polymer Bond

640

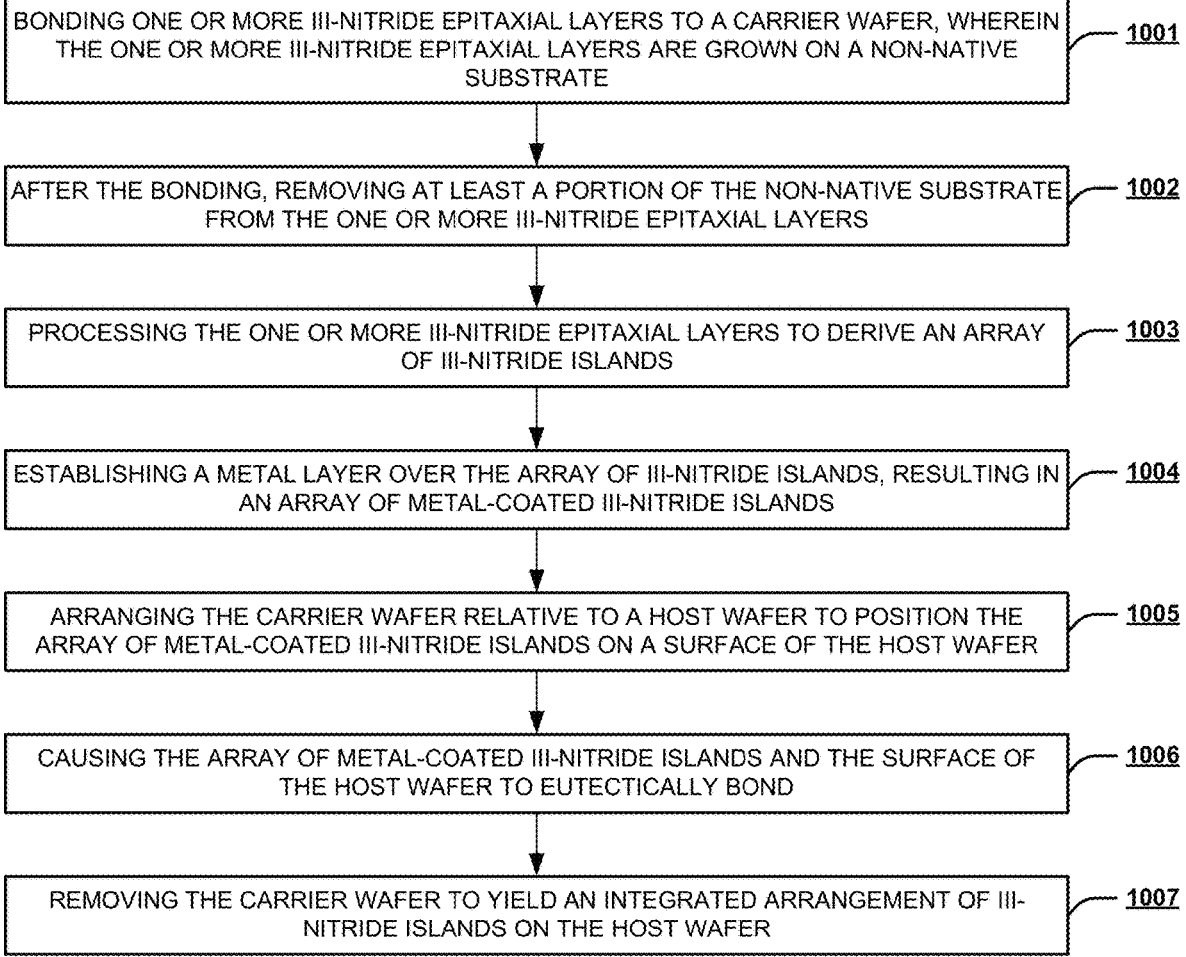

BONDING ONE OR MORE III-NITRIDE EPITAXIAL LAYERS TO A CARRIER WAFER, WHEREIN THE ONE OR MORE III-NITRIDE EPITAXIAL LAYERS ARE GROWN ON A NON-NATIVE SUBSTRATE — 1001

AFTER THE BONDING, REMOVING AT LEAST A PORTION OF THE NON-NATIVE SUBSTRATE FROM THE ONE OR MORE III-NITRIDE EPITAXIAL LAYERS — 1002

PROCESSING THE ONE OR MORE III-NITRIDE EPITAXIAL LAYERS TO DERIVE AN ARRAY OF III-NITRIDE ISLANDS — 1003

ESTABLISHING A METAL LAYER OVER THE ARRAY OF III-NITRIDE ISLANDS, RESULTING IN AN ARRAY OF METAL-COATED III-NITRIDE ISLANDS — 1004

ARRANGING THE CARRIER WAFER RELATIVE TO A HOST WAFER TO POSITION THE ARRAY OF METAL-COATED III-NITRIDE ISLANDS ON A SURFACE OF THE HOST WAFER — 1005

CAUSING THE ARRAY OF METAL-COATED III-NITRIDE ISLANDS AND THE SURFACE OF THE HOST WAFER TO EUTECTICALLY BOND — 1006

REMOVING THE CARRIER WAFER TO YIELD AN INTEGRATED ARRANGEMENT OF III-NITRIDE ISLANDS ON THE HOST WAFER — 1007

HETEROGENEOUS CHIP INTEGRATION OF III-NITRIDE-BASED MATERIALS FOR OPTOELECTRONIC DEVICE ARRAYS IN THE VISIBLE AND ULTRAVIOLET

CROSS REFERENCE TO RELATED APPLICATIONS

The present application claims the benefit of priority to U.S. Provisional Application No. 63/185,800 filed on May 7, 2021 and U.S. Provisional Application No. 63/154,399 filed on Feb. 26, 2021. All sections of the aforementioned applications are incorporated herein by reference in their entirety.

FIELD OF THE DISCLOSURE

The subject disclosure generally relates to heterogeneous chip integration of III-Nitride-based materials for optoelectronic device arrays in the visible and/or ultraviolet (UV) spectrums.

BACKGROUND

Wide band gap semiconductors such as III-Nitride materials—e.g., aluminum nitride (AlN), indium nitride (InN), or gallium nitride (GaN)—are well-suited for modern electronic and optoelectronic applications. In fact, it is expected that III-Nitride-based light emitting diodes (LEDs) will replace traditional light bulbs and revolutionize lighting.

Silicon (Si) is a preferred semiconductor material for heterogeneous integration because it is easily processed, it is readily available at reasonable cost and high quality, and complex, very large-scale integration (VLSI) electronic circuits are also readily available. However, it has been relatively difficult to integrate III-Nitride-based materials with electronic devices fabricated on silicon. Most active photonic devices require a single crystal material, which is difficult to grow on silicon due to the large lattice mismatch between the silicon and the semiconductor with the proper band gaps.

BRIEF DESCRIPTION OF THE DRAWINGS

Reference will now be made to the accompanying drawings, which are not necessarily drawn to scale, and wherein:

FIG. 10 depicts an example, non-limiting method in accordance with various aspects described herein.

DETAILED DESCRIPTION

Figure 1A:
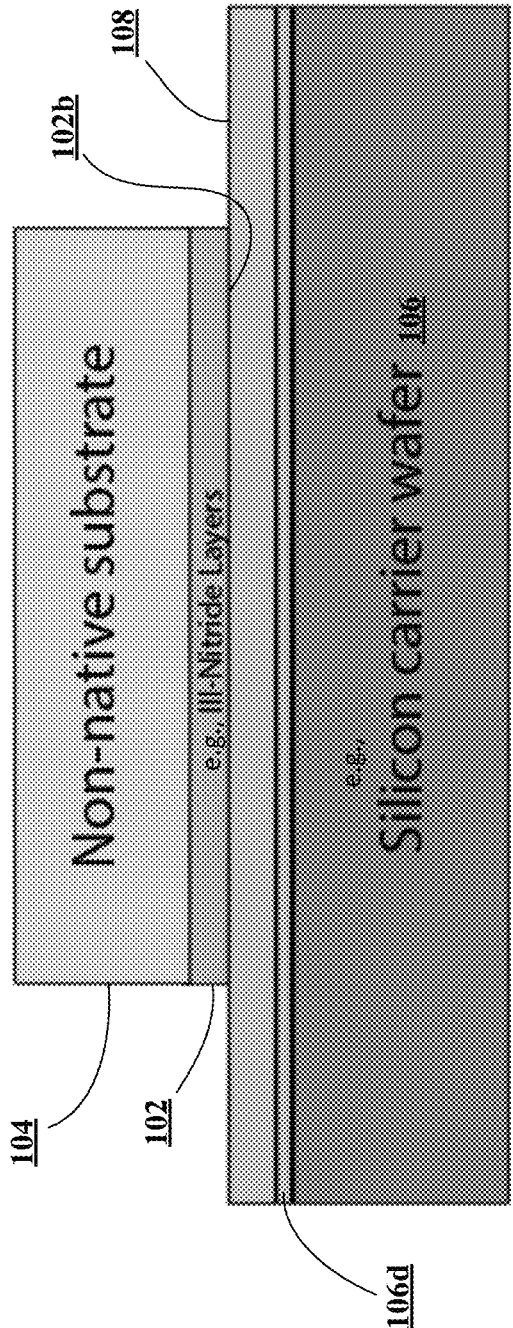
FIGS. 1A-1H and 1J are diagrams illustrating, among other things, an example process flow of epitaxial bonding and epitaxial transfer for an individual arrangement of III-Nitride islands/pixels in accordance with various aspects described herein.

The subject disclosure describes, among other things, illustrative embodiments for heterogeneously integrating III-Nitride (or other wide band gap or group III-V) materials with a non-native substrate/wafer, such as that composed of silicon. Exemplary embodiments provide for large-scale integration of such materials onto a CMOS electronics platform in a scalable and integrative manner.

In various embodiments, heterogenous integration may be realized by employing a sequence of techniques that includes epitaxial bonding and epitaxial transfer of one or more III-Nitride epitaxial materials. The III-Nitride epitaxial material(s) may be grown on any suitable substrate, such as a non-native substrate composed of silicon (e.g., silicon <100>, silicon <111>, or the like), silicon carbide, sapphire, diamond, bulk GaN, or the like. In a case where III-Nitride epitaxial layers are composed of GaN, indium gallium nitride (InGaN), indium aluminum nitride (InAlN), indium gallium aluminum nitride (InGaAlN), and/or AlN, for instance, a substrate composed of silicon, silicon carbide, sapphire, or diamond may be non-native to these III-Nitride epitaxial materials. In a case where III-Nitride epitaxial layers are composed of InGaN, InAlN, InGaAlN, and/or AlN, for instance, a GaN substrate may be non-native to these III-Nitride epitaxial materials. In one or more embodiments, a III-Nitride epitaxial material structure (e.g., set for a certain wavelength or range of wavelengths) may be converted into a grid (or other desired structure) of photo-lithographically-aligned islands, and (e.g., permanently) positioned, in unison, on a silicon substrate/wafer. The process may be iterated for one or more additional III-Nitride epitaxial material structures (e.g., set for the same or different wavelength or ranges of wavelengths) to yield a complementary array that "fits" together as bond-aligned materials on a (e.g., single) chip array or CMOS-based platform, which may incorporate circuitry for driving or controlling devices fabricated in the bonded material.

In exemplary embodiments, epitaxial bonding may involve preparing bulk, large-area III-Nitride semiconductor(s) (e.g., GaN-based LED epitaxial structure(s)) on a carrier wafer by positioning the epitaxial layers (e.g., face-down) onto the carrier wafer and bonding the two via a thermally-cured (e.g., temporary) bonding polymer. The non-native substrate (upon which the bulk, large-area materials may be grown) may then be removed (e.g., via a dry-etch process, a selective wet chemical etch process, a chemo-mechanical lapping/polishing process, etc.), and the bulk, large-area materials may be converted into (e.g., precisely-defined) regions of thin-film III-Nitride epitaxial "islands." In various embodiments, the III-Nitride islands may be photolithographically-defined and established using methods that comport to both CMOS-compatibility and photonic device constraints. In one or more embodiments, a layer of metal (e.g., aluminum (Al)) may be deposited on a top surface (formerly non-native substrate side) of (e.g., each of) the islands.

In exemplary embodiments, epitaxial transfer may involve positioning (e.g., flipping the full) arrangement of III-Nitride epitaxial islands, in unison, onto a final, host substrate, and (e.g., permanently) bonding them in a manner that maintains the alignment and exact arrangement of the materials (e.g., as may be previously defined). In embodiments where the metal layer includes Al and the host substrate includes silicon (such as silicon <100>), for instance, a metal-eutectic bond may be formed between the host substrate and the (e.g., face-up) aluminum layer on the III-Nitride islands by (e.g., simultaneously) applying heat (e.g., to the Al—Si eutectic point of 577° C.) and force to the interface, resulting in a (e.g., permanent) bond between the silicon substrate and the aluminum-coated III-Nitride islands. Here, the aluminum-silicon eutectic bond may mechanically secure the III-Nitride islands onto their "final resting place." A solvent-based removal procedure may also be performed to remove any remaining (e.g., temporary) bonding polymer. Use of the resulting, integrated arrangement of III-Nitride islands to derive array(s) of photonic pixels enables the development of optoelectronic devices that have improved overall electrical and optical performance, as described herein. In some alternate embodiments, other metal layer materials and/or host substrate materials may be utilized, and thus other eutectic or peritectic bonds may be formed—e.g., indium-palladium (In—Pd) bonds, aluminum-germanium (Al—Ge) bonds, etc.

In exemplary embodiments, the epitaxial bonding and epitaxial transfer processes may be iterated for bonding other (e.g., different) arrays of III-Nitride islands onto the aforementioned host substrate. In one or more embodiments, such bonding may be facilitated via bond-alignment tooling. Fabrication of desired III-Nitride-based devices (e.g., quantum information emitters/detectors in the UV spectrum, UV (germicidal) light emitters, visible light communications (VLC) "LiFi" transceivers, chip-to-chip interconnects, etc.) may proceed in unison, for example, after all heterogeneous materials have been integrated together. Here, each array may be in a complementary arrangement relative to a "previous" array such that the total photonic pixel distribution on the host substrate "fits" together with micron-scale precision. Various embodiments described herein may employ/leverage available tooling to enable the fabrication of optoelectronic devices embedded onto a CMOS platform for full electronic controls on a common substrate, such as silicon.

Exemplary embodiments described herein provide for fabrication of chipsets that mesh the electrical and optical domains into a single heterogeneously-integrated circuit, and thus enable the development of a wide range of optoelectronic devices that span the full range of light intensity. A heterogeneously-integrated circuit may include distributed pixel array(s) and highly-reflective surface(s) underneath emitters that, together, allow for more light to be collected from/in the device, which provides for improved device efficiency.

Various methods for integrating group III-V materials onto silicon have been pursued, with the aim of defining a scalable means for production. These methods broadly fall under the umbrella of "heterogeneous integration." One of these methods relies on growing III-Nitride semiconductors—e.g., GaN-based materials—directly onto (final host) Si-based substrates (as opposed to other substrates) using metal-organic chemical vapor deposition (MOCVD). In the case of GaN-based semiconductors, growing on a silicon substrate requires that the silicon be formed along the <111> crystalline axis, rather than the standard <100> direction, in order to allow for the GaN <0001> crystalline axis to match the underlying silicon crystal formation and to reduce defect density to acceptable levels. Further, the use of silicon <111> in GaN technologies is non-standard to CMOS fabrication, and attempting to use this substrate for standard CMOS front-end-of-line (FEOL)/back-end-of-line (BEOL) processes would require processing techniques to be fully adjusted and re-optimized for new crystal anisotropies with that crystal direction, thus effectively hindering its adoption. Additionally, the yield of III-Nitride growths on various substrates, including silicon <111>, tends to drop off toward the edges of the wafer, making large areas of the wafer unusable. Further, such processes for GaN would expose any FEOL-processed silicon <111> wafers to high heat in the III-Nitride growth process, potentially harming the underlying electronic device layouts and causing undesirable over-annealing of impurity-doping profiles.

Various other techniques are used to bond III-V materials onto silicon, such as those that involve polymer bonding, dielectric bonding, hydrophilic (oxide) bonding, or flip-chip solder-ball bonding. Each of these techniques provides for individual fabrication of laser device die, and is thus not scalable and fails to improve overall device performance. Additionally, in bonding techniques that utilize a polymeric or dielectric material (i.e., benzocyclobutene (BCB)) to unite III-Nitride with silicon, resulting devices made from the bonded materials have sub-par thermal performance owing to the thermal and electrical isolation of the materials above the silicon wafer. This directly limits the electronic and photonic output of the resulting devices. Low temperature hydrophilic bonding between oxidized materials can also impair the performance of photonic devices due to lattice mismatch of materials, and can greatly constrain the flatness of both materials needed to ensure good contact. Such flatness specifications for oxide-based bonds are highly costly to achieve. The presence of bond voids in such oxide-based bonding techniques and polymer techniques also has the potential to limit the interplay between photonic and electronic device layers, and accrues thermal and electrical losses. Older epitaxial liftoff (ELO) methods of bonding also tend to strain any resulting devices given the use of black wax and harsh hydrofluoric acid needed to etch at selective layers and to remove the remaining III-Nitride substrate. This can mandate additional considerations in material choice due to the need for a liftoff layer in the layer design and the issue of CMOS's own sensitivity to the same chemicals. The handling/alignment of individual device die onto a single silicon substrate, as required in the aforementioned bonding techniques, is also costly. Relying on discrete die to form large scale electronic-photonic circuitry requires expensive tooling for micron-scale alignment that is needed to maintain device efficiency and performance, which greatly adds to capital costs. Further, flip-chip bonding has thus far strained the scalability of incorporating III-Nitride onto silicon. In addition, techniques that resort to directly bonding the top side of the epitaxial layers onto silicon (as opposed to bonding at the back side underneath all epitaxial layers) can pose issues since photonic devices made in this manner result in an inverted refractive index profile in the material stack (relative to monolithic devices), and the material used for bonding may be very close to the active regions and thus may parasitically drain injected electrical power.

Embodiments for epitaxial bonding and epitaxial transfer, described herein, address the various abovementioned limitations associated with conventional integration of III-Nitride materials, including the sub-par thermal performance of resulting devices and the high costs associated with existing methods of handling and alignment of the III-Nitride devices relative to a substrate.

Exemplary embodiments described herein enable a variety of commercial uses, including applications that require multiple optoelectronic devices that span multiple wavelengths, optoelectronic devices with multiple distinct functions on the same die, and/or the integration of an optoelectronic function directly with its corresponding electronic driver or control circuitry. Novel chipsets for both enterprise and consumer use may be provided, where a single silicon chip can be embedded with optically-sensitive materials and then fabricated into devices to be placed in a network or room setting for strong emission or detection of specifically sequenced visible/UV light. Such optical-sequences can be tailored directly by means of the electronic drive circuitry that surrounds the optoelectronics.

Various embodiments described herein enable fabrication of an integrated system that includes an array of optoelectronic devices configured to vertically emit in desired ranges and where CMOS electronics in the substrate directly integrate signal modulation to the photonic pixels such that beam-forming may be performed (using the photonic pixels) to deliver higher energy lighting or improved, focused lighting as compared to devices created using non-integrated techniques. This provides for laser or LED systems that can adjust in wavelength, beam profile, and energy based on the arrangement of heterogeneously integrated material.

Enabling the formation/incorporation of a plurality of (e.g., arrays of) pixels covering a wide range of wavelength emission on a (e.g., single) chip of an integrated platform provides for an electronically-controllable and highly-efficient optoelectronic system. Exemplary implementations can be configured with photodetector pixels (e.g., based on Si, germanium (Ge), indium gallium arsenide (InGaAs), etc.) that provide enhanced light detection in an environment of CMOS-based LED driver circuitry and photoemitter pixels embedded directly in/on the (e.g., same) substrate, without affecting the heterogeneous arrangement of the various photonic pixels.

It is believed that there are presently no products on the market that combine germicidal (UV) light with white light in a single packaging. Solid-state bulbs that emit white light are typically made by growing GaN-based semiconductors on a substrate of sapphire, and packaging them with a phosphor cap to transition the light from blue to the full visible spectrum. Germicidal light bulbs have historically been made using mercury lamps, although new technologies have allowed for different combinations of GaN-based semiconductors as well, where the material is also grown on sapphire substrates. There are several disadvantages with conventional white and germicidal light bulb implementations. First, mercury lamps are toxic, are inherently less efficient than solid-state, and have an emission wavelength of 254 nanometers (nm), which is different from the peak germicidal wavelength of 265 nm. Also, a sapphire substrate is relatively thermally insulating as compared to silicon (and very insulating as compared to aluminum), and thus keeping such a native substrate for both white light and germicidal light causes the devices to experience thermal wear, thus shortening their lifetime. Further, conventional germicidal LEDs are packaged separately, which prevents an integrated approach that could otherwise help improve device lifetime and efficiency. Finally, any conceived combination of discrete white light and germicidal light die packages in the same emitter assembly would also increase assembly costs, reduce device lifetime, and potentially distort beam-forming geometries as compared to a heterogeneously integrated approach.

Embodiments described herein enable fabrication of a single die that includes both germicidal and white light emitters. Such an integrated chip can, for instance, allow a room to be illuminated with white light in the presence of humans/animals and illuminated with germicidal (UV) light during off-hours such that surfaces and floors are disinfected, sanitized, and water sources are purified. Electronic-photonic controls in the silicon host wafer can also be made user-programmable, which enables incorporation of safety mechanisms into the high-brightness, high-dose germicidal emitters and reduces or eliminates the need for two separate illumination sets. A system designed using such an integrated chip can also be configured with LiFi light transceiver (s) (for general networking) and/or Internet-of-Things (IoT) systems through the integration of high-speed drivers on the silicon host wafer. Integrated GaN devices may also be used for a wide range of optical links—e.g., chip-to-chip, within rack, between rack, etc.

In the area of non-classical (quantum) information processing, the optical sources for quantum information require wavelengths that minimize environmental decoherence and solar irradiance, and thus high-energy photons in the UV range are often used. Today, many of the sources of quantum information signals are emitted from trapped ions (i.e., $171Yb+$ at 369.5 nm, 88Sr+ at 422 nm, etc.) in the blue and ultraviolet range, but for transmission across long distances, photons in the telecom band (e.g., 1310 nm or 1550 nm) with minimized dispersion/attenuation are preferred. Thus, platform implementations are typically limited to bulk nonlinear crystals that can convert ultraviolet photons to/from telecom (1310 nm, 1550 nm) photons via second or third harmonic generation without loss of quantum coherence. In these systems, there is, again, no integration onto a single common silicon wafer and, typically, a benchtop pump laser to excite the states is assumed, which prevents scaling up due to the off-chip nature of the setup. There is ample work in III-Nitride-based single photon emitters that use quantum dot growths to emit in the UV, but these devices are presently limited to their native substrate and are not currently interconnectable with a silicon electronics network. Research into other types of quantum information devices—including memory, buffers, photon detectors, and logic gates—has led to techniques focused on ultraviolet (or blue) photon sensitivity, yet these approaches typically involve benchtop setups that lack direct bonding into a classical (CMOS) network, and thus do not provide for measurement/collapsing of the state of quantum signals as needed.

Providing the ability to integrate optical devices directly into/onto a CMOS electronics platform, as described herein, enables chip fabrication and packaging for quantum information processing systems. For instance, various embodiments allow for new fiber-optic link designs that directly integrate control electronics along the length of the fiber. These fibers can house both the integrated sources/detectors as well as the material used to convert from telecom bands to UV/visible photons. Such a quantum Internet system can include integrated chips as part of the nodes or "quantum repeaters" located along the length of the network that serve as points of signal amplification, without loss of coherence or violation of the 'no-cloning' theorem in quantum information. Such integrated chips can also be directly (and separately) packaged into a classical computing computer processing unit (CPU), where a set amount of board space may be assigned to actions relating to a non-classical quantum information network but governed by a classical control network.

In the nascent field of visible light communications (VLC), also known as "LiFi," there is presently no means for directly integrating the necessary drive circuitry with the LEDs needed to perform the data transmission. LiFi devices are currently retrofitted out of available white light LEDs or arrangements of individual color (e.g., red-green-blue (RGB)) LEDs to enable the desired color shift keying (CSK) for proper data rates. While these designs are being considered for use in automotive lights and enterprise IoT applications, evaluations of how these designs ought to be integrated directly onto an electronics platform (for optimal beam patterning and emission) are still ongoing. Some initial research has led to the integration of LiFi with image sensors—i.e., CMOS cameras—for the light detection capabilities of the CMOS layout, but these designs do not incorporate CMOS logic or circuitry, and rather only employ prepackaged image sensors.

Chips designed using embodiment(s) described herein could be packaged into various housings and products and then implemented as both the optically-sensitive materials and electrical controls for a variety of systems, ranging from those that can create large-signal light to those that can create very small-signal (i.e., single photon) light. This can include integrated chips that can be made into visible light (LiFi) devices with a plurality of channels as well as other devices, such as, for example, high-dose germicidal (UV-C) illuminators, high-brightness beam-formed illumination systems, nonlinear second harmonic generation nodes, quantum optics buffers/memory, and vertically-emitting single photon emitters/detectors in the ultraviolet or visible spectrums. This can also include integrated chips whose III-Nitride material has first been altered by diffusion, ion implantation, thermal annealing, or other impurity incorporation processes in such a manner to alter the optoelectronic response of devices formed into them.

One or more aspects of the subject disclosure include a method. The method may include bonding one or more III-Nitride epitaxial layers to a carrier wafer, wherein the one or more III-Nitride epitaxial layers are grown on a non-native substrate. Further, the method may include, after the bonding, removing at least a portion of the non-native substrate from the one or more III-Nitride epitaxial layers. Further, the method may include processing the one or more III-Nitride epitaxial layers to derive an array of III-Nitride islands. Further, the method may include establishing a metal layer over the array of III-Nitride islands, resulting in an array of metal-coated III-Nitride islands. Further, the method may include arranging the carrier wafer relative to a host wafer to position the array of metal-coated III-Nitride islands on a surface of the host wafer. Further, the method may include causing the array of metal-coated III-Nitride islands and the surface of the host wafer to eutectically bond. Further, the method may include removing the carrier wafer to yield an integrated arrangement of III-Nitride islands on the host wafer.

One or more aspects of the subject disclosure include an integrated device. The integrated device may include a host wafer having a surface. Further, the integrated device may include an array of III-Nitride islands positioned on the surface based upon epitaxial transfer of the array of III-Nitride islands from a carrier wafer, wherein the array of III-Nitride islands is eutectically bonded with the surface of the host wafer to form a reflective interface.

One or more aspects of the subject disclosure include a heterogenous integration process. The process may include epitaxially bonding wide band gap semiconductor materials with a silicon carrier wafer, wherein the wide band gap semiconductor materials are grown on a non-native substrate. Further, the process may include removing the non-native substrate from the wide band gap semiconductor materials. Further, the process may include defining and deriving an array of wide band gap semiconductor islands. Further, the process may include establishing a metal layer over the array of wide band gap semiconductor islands, resulting in an array of metal-coated wide band gap semiconductor islands. Further, the process may include epitaxially transferring the array of metal-coated wide band gap semiconductor islands to a surface of a host wafer. Further, the process may include forming a eutectic bond between the array of wide band gap semiconductor islands and the surface of the host wafer.

Other embodiments are described in the subject disclosure.

FIGS. 1A-1H and 1J are diagrams illustrating, among other things, an example process flow of epitaxial bonding and epitaxial transfer for an individual arrangement of III-Nitride islands/pixels in accordance with various aspects described herein. As shown in FIG. 1A, one or more layers of wide band gap materials that are capable of emitting/detecting visible and/or UV light and/or that have band gaps that satisfy a defined threshold value, such as, for example, about 2 electron volts (eV)—here, III-Nitride-based material layers/wafers 102 (e.g., Al-based nitrides, Ga-based nitrides, In-based nitrides, etc.)—may be epitaxially grown on a substrate 104 (in a stacked manner where the III-Nitride layers are continuous across a plane of the substrate 104). As depicted in FIG. 1A, the III-Nitride-based layers 102 may be bonded to a carrier semiconductor wafer 106. The carrier wafer 106 may be composed of silicon, although it may be composed of one or more additional or alternative semiconductor materials. The substrate 104 may be composed of a material that is non-native to the III-Nitride materials. Particularly, the substrate 104 may be electrically, chemically, and/or thermally dissimilar from the III-Nitride epitaxial layers 102. In exemplary embodiments, the substrate 104 may be composed of silicon <111>, sapphire, silicon carbide, another type of non-native material, or a combination of some or all of these materials. In a case where III-Nitride epitaxial layers 102 are composed of GaN, InGaN, InAlN, InGaAlN, and/or AlN, for instance, a substrate 104 composed of silicon, silicon carbide, sapphire, or diamond may be non-native to these III-Nitride epitaxial materials. In a case where III-Nitride epitaxial layers 102 are composed of InGaN, InAlN, InGaAlN, and/or AlN, for instance, a GaN substrate 104 may be non-native to these III-Nitride epitaxial materials.

Epitaxial bonding may involve preparing III-Nitride semiconductors on a carrier wafer, and converting the III-Nitride semiconductors from bulk large-area materials to precisely-defined regions of thin-film III-Nitride epitaxial "islands." In exemplary embodiments, a (e.g., temporary) bonding polymer 108 may be applied to a surface of the carrier wafer 106 (here, for example, a dielectric layer 106d thereof), and a bulk of III-Nitride layers 102 (along with its non-native substrate 104) may be positioned on the bonding polymer 108. In certain alternate embodiments, a surface 102b of the III-Nitride layers 102 (e.g., a back side underneath the layers) may be applied with the bonding polymer 108 and subsequently positioned on the carrier wafer 106. The bonding polymer 108 may be composed of any suitable type of bonding material, such as, for example, a polyimide-based substance or the like.

Figure 1B:
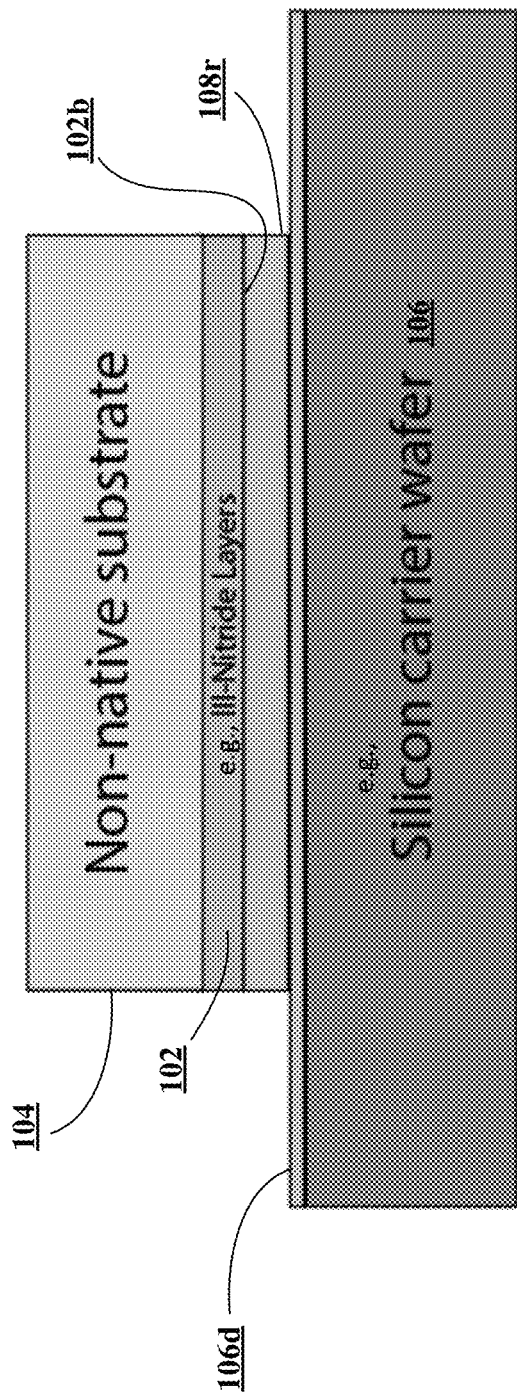

As shown in FIG. 1B, excess portions of the bonding polymer 108 may be removed, leaving behind bonding polymer portion 108r. For instance, in a case where the bonding polymer 108 is applied over an area of the surface of the carrier wafer 106 that is larger than an area of the surface 102b of the III-Nitride layers 102, excess portions of the bonding polymer 108 beyond the area of the surface 102b may (e.g., after the III-Nitride layers 102 are positioned on the carrier wafer 106) be removed. Removal of the excess portions may be performed using any suitable technique, such as a dry-etch process—e.g., an oxygen-based plasma cleaning process.

Figure 1C:
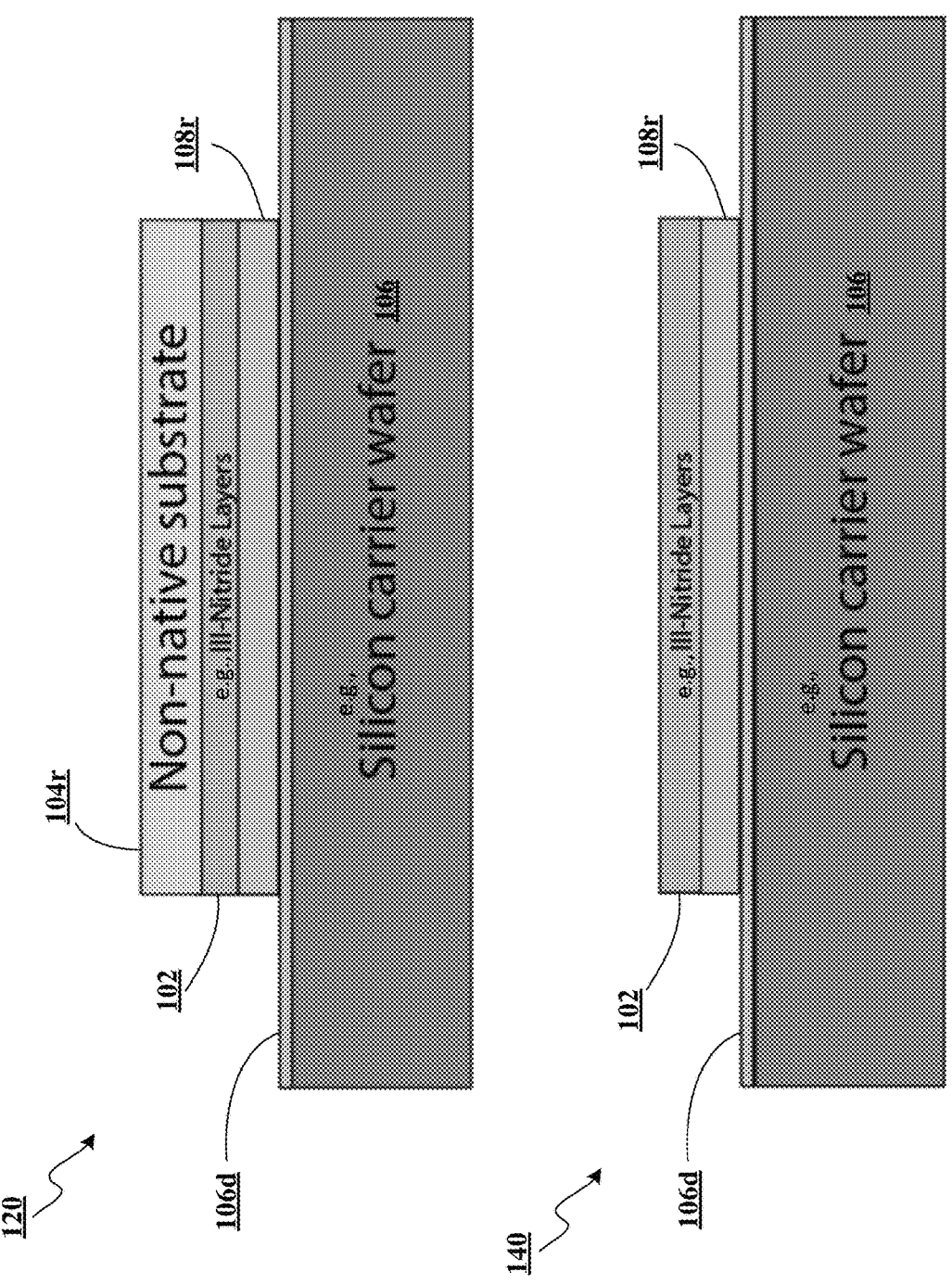

With reference to FIG. 1C, processing for the non-native substrate 104 may be performed to expose the III-Nitride layers 102. In exemplary embodiments, one or more of lapping/thinning and (e.g., chemical) dry-etching may be performed to remove the non-native substrate 104 (e.g., to completely remove the non-native substrate 104 or to at least partially remove the non-native substrate 104, where a thin layer of the non-native substrate 104 is either intentionally or unintentionally left behind). The non-native substrate 104 may be lapped/thinned in any suitable manner, such as via chemo-mechanical polishing, which may involve the use of one or more reactive slurries/pads that are suitable for the non-native substrate material. For a silicon-based non-native substrate, diamond-based lapping slurries/pads may be utilized, whereas, for other types of non-native substrate materials, other types of grits may be utilized. In some embodiments, a coarse lapping step may first be performed on the non-native substrate 104 followed by thinning via chemo-mechanical polishing to prepare a smooth surface. As shown by reference number 120, a smaller portion 104r of the non-native substrate may remain after initial lapping/thinning.

In various embodiments, chemical dry-etching may be performed (e.g., after initial lapping/thinning) for final substrate removal. Any appropriate chemical dry-etching process may be utilized. For a silicon-based non-native substrate, such as silicon <111>, a xenon difluoride $(XeF_2)$-based method may be utilized. In exemplary embodiments, the non-native substrate 104 (or here, the remainder 104r thereof) may be completely removed (140) such that the III-Nitride layers 102 are (e.g., completely) exposed. Full removal of the non-native substrate 104 may be important to obtain (e.g., optimal or improved) reflectivity—i.e., high reflectivity—off of a metal mirror layer (described in more detail below). As chemical dry-etching may require an "etch stop," the III-Nitride layers 102 may, in various embodiments, serve as such a stop to facilitate the substrate removal process.

Figure 1D:
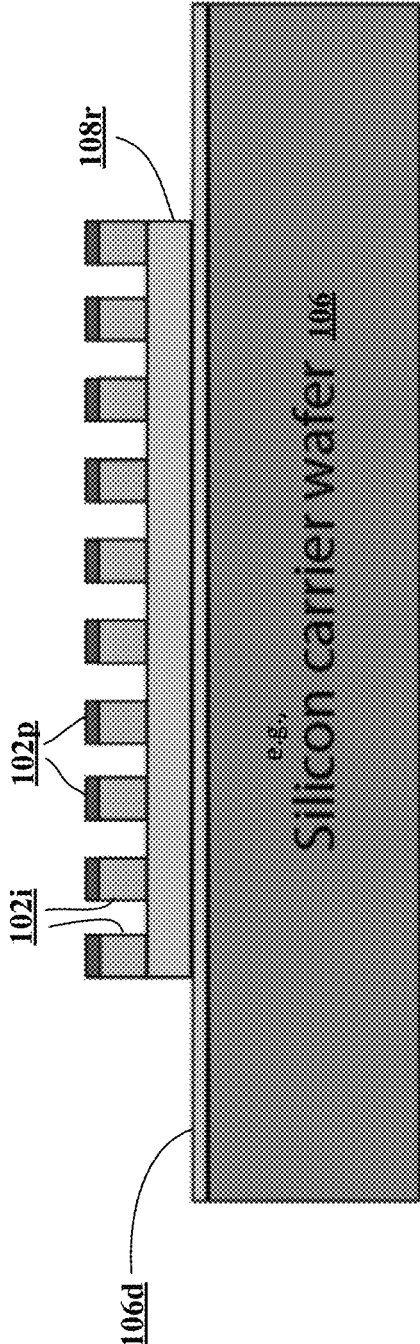

As shown in FIG. 1D, the III-Nitride layers 102 may be processed into an array of islands 102i. Such processing may be performed using any suitable method. In exemplary embodiments, the processing may include photolithographically defining and etching the III-Nitride layers 102 into the array of islands 102i. Photolithography may involve one or more of various steps, including, for example, applying/ spinning of a photoresist layer on the III-Nitride layers 102, alignment of a mask (e.g., silicon dioxide or the like) over the III-Nitride layers 102, applying light (e.g., UV light) to the apparatus, and performing an etching process, such as an oxide etching process. In various embodiments, the photolithographic process may be performed based on pre-alignment parameters that define various characteristics of the resulting islands 102i, such as, for example, dimensions of each of the islands 102i, spacing between different ones of the islands 102i (such that, for instance, any two resulting islands 102i may be aligned relative to one another in a desired manner), and/or the like. As shown in FIG. 1D, photoresist portions 102p may be overlaid on the III-Nitride islands 102i as part of the photolithographic process.

Although FIG. 1D shows the array of III-Nitride islands 102i as being a two-dimensional array, it is to be appreciated and understood that the array may instead by a three-dimensional array or matrix of III-Nitride islands.

As described in more detail below, each island 102i may be subsequently processed/fabricated with one or more devices—e.g., photonic pixels—as part of realizing an ultimate desired integrated chip system. A photonic pixel may be an individual light emitter or detector, and each island 102i may be processed to include a single photonic pixel (in which case the island may constitute an individual light emitter/detector) or may alternatively be processed to include multiple photonic pixels (in which case the island may constitute a combination of light emitters/detectors).

Figure 1E:
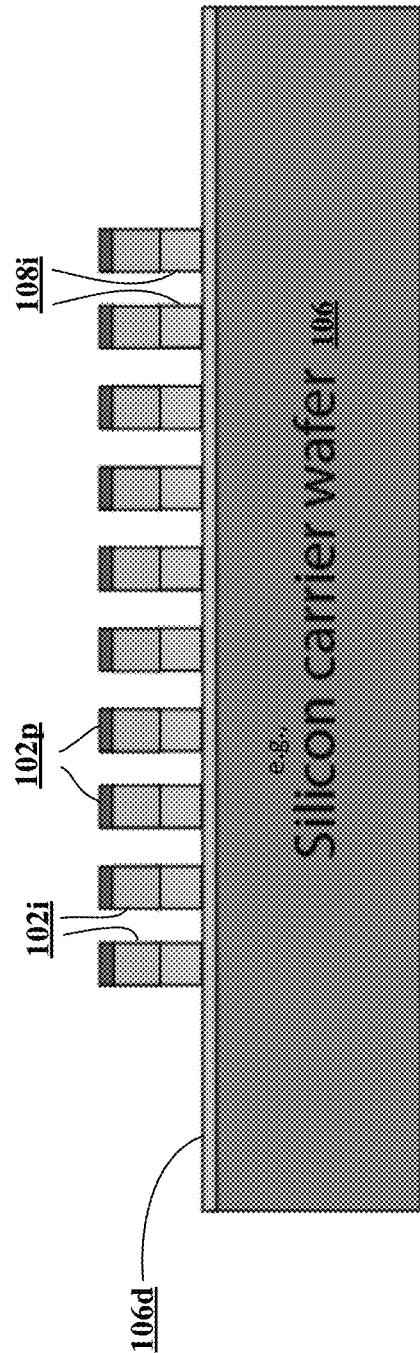

As shown in FIG. 1E, portions of the bonding polymer 108r may be removed such that bonding polymer portions 108i remain. Removal of the portions may be performed using any suitable technique, such as a dry-etch process—e.g., an oxygen-based plasma cleaning process.

Figure 1F:
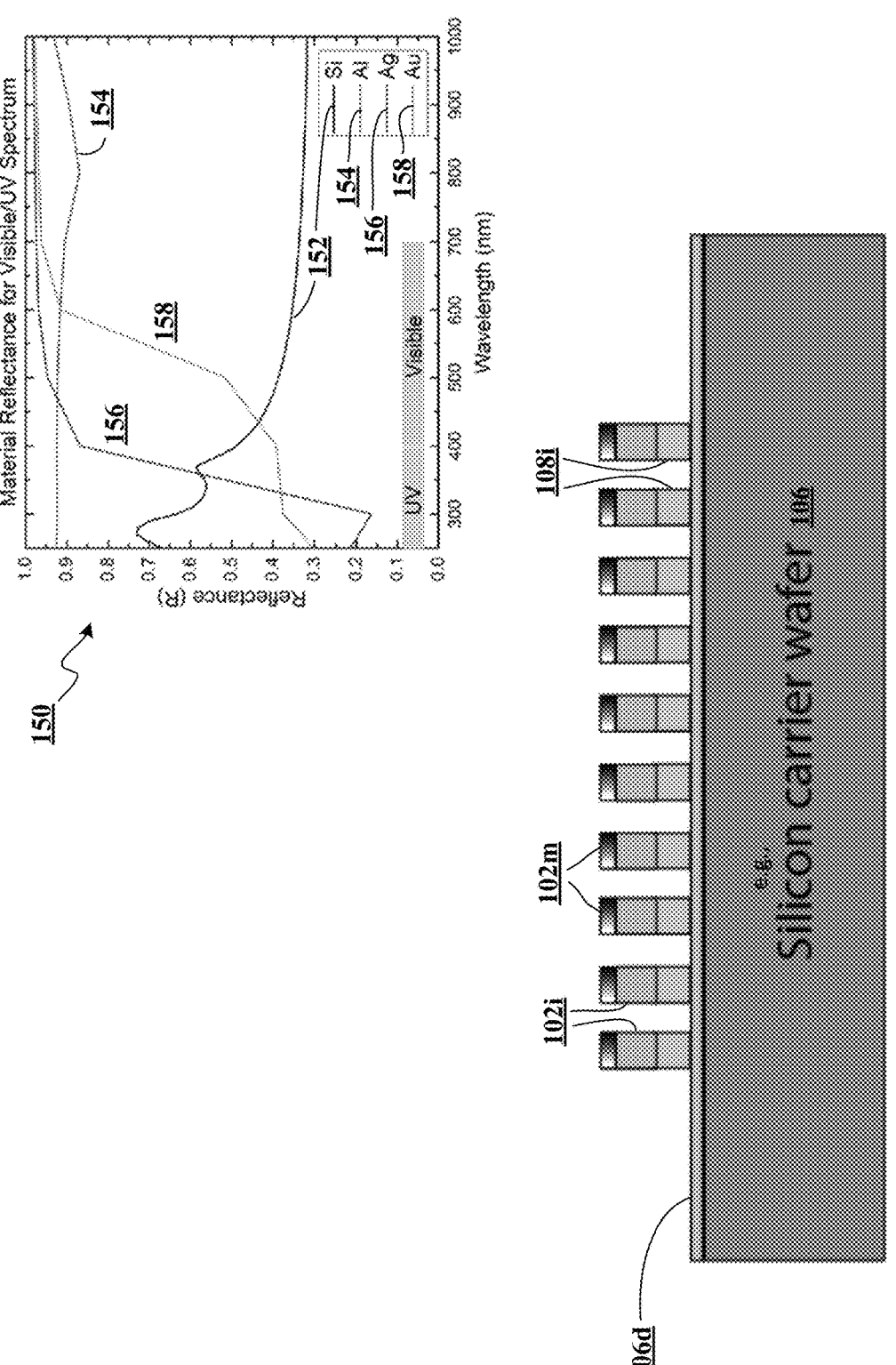

As shown in FIG. 1F, a metal (mirror) layer may be established on the III-Nitride islands 102i, resulting in metal layer portions 102m on the respective III-Nitride islands 102i. The metal layer may be composed of any suitable metal material or combination of metal materials (i.e., any eutectic or peri-eutectic metal) and may be established at any suitable amount or thickness. For instance, the metal layer may be composed of one or more of aluminum (Al), gold (Au), or silver (Ag) material. As one example, the metal layer may be a 100 to 500 nm-thick layer of Al. In exemplary embodiments, the metal layer may be composed of aluminum due to its consistent reflectance in the range of III-Nitride light emission and detection (see reference number 150 of FIG. 1F, illustrating the material reflectance of Si (152), Al (154), Ag (156), and Au (158) in the visible and UV spectrums).

The metal layer may be established in any suitable manner In exemplary embodiments, the metal material may be evaporated onto the III-Nitride islands 102i via a metal deposition process, which may involve electron beam deposition, sputtering, and/or resistive heating such that the metal deposits onto the III-Nitride islands 102i as metal layer portions 102m. In one or more embodiments, a (e.g., liftoff) photolithographic process may be performed to define locations where the metal material is to be patterned or positioned on the III-Nitride islands 102i. In some embodiments, blanket metal deposition may be performed via an etch process, where a blanket metal material may be deposited over the III-Nitride islands 102i and subsequently subjected to photolithography such that portions of the metal material are etched away from predefined locations/regions.

It is to be appreciated and understood that, in various embodiments, additional material removal steps may be performed prior to, or (e.g., substantially) simultaneously with, establishment of the metal layer on the III-Nitride islands 102i. For instance, where a mask is used in the photolithographic process described above with respect to FIG. 1D, the mask may be removed, such as via a dry-etch process or the like. Similarly, where photoresist is applied on the III-Nitride islands 102i as part of the photolithographic process described above with respect to FIG. 1D, the photoresist may be removed, such as a via an oxygen plasma cleaning process.

It is also to be appreciated and understood that the metal layer may (e.g., for purposes of process economy) be established/deposited at any suitable point during/after epitaxial bonding. For instance, rather than establishing the metal layer after the III-Nitride islands 102i have been formed, in some alternate embodiments, the metal layer may be used as the mask material in the photolithographic process described above with respect to FIG. 1D. Here, metal material(s) that have minimal to no reaction to subsequent III-Nitride etch processing may be chosen for the metal layer.

Figure 1G:
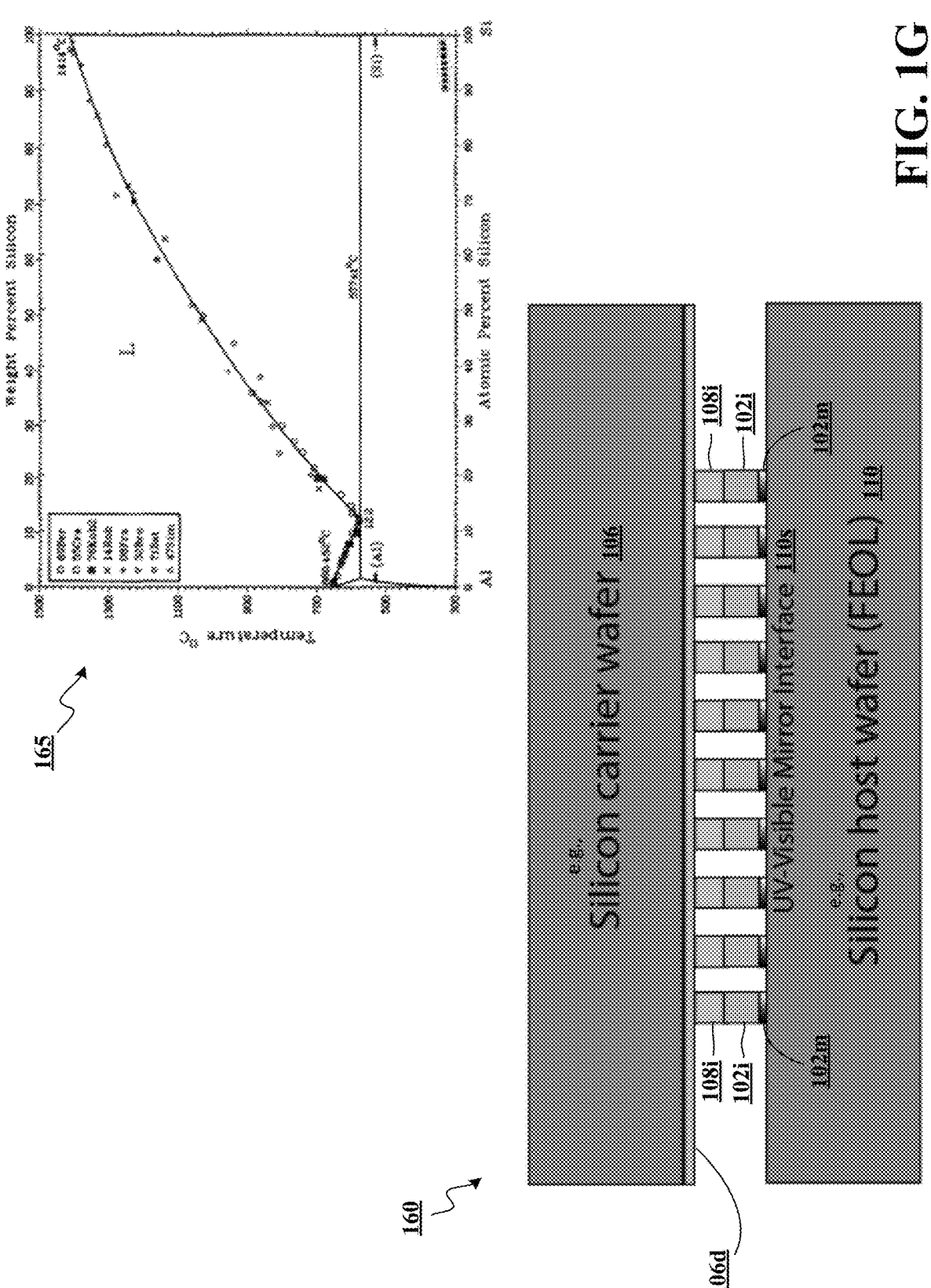

As shown by reference number 160 in FIG. 1G, the carrier construction described thus far (e.g., FIG. 1F) may be brought together with a (e.g., final) host semiconductor wafer 110 as part of an epitaxial transfer process. The host wafer 110 may be composed of silicon, although it may be composed of one or more additional or alternative semiconductor materials. The epitaxial transfer process may involve "flipping" the arrangement of III-Nitride islands onto the host substrate in unison, and permanently bonding the host substrate and the III-Nitride islands in a manner that maintains any previously-defined alignment/arrangement of the III-Nitride islands relative to one another and/or relative to elements/components of the host substrate.

Alignment involved in the epitaxial transfer process may be performed in any suitable manner. For instance, as part of an alignment procedure, the carrier wafer arrangement may be positioned over the host substrate wafer 110, and alignment features on each of the wafers may be determined. In exemplary embodiments, the alignment procedure may be based on (previously) precisely-defined locations of the islands (e.g., relating to the photolithographic process described above with respect to FIG. 1D) that identify how all of the islands are to be referenced to one another when they are subsequently positioned on the host wafer 110. The advantage of defining all of the III-Nitride islands 102i as described above and effecting a wafer-scale process of (e.g., substantially) simultaneously positioning all of the islands onto the host wafer 110 eliminates a need to create/position individual islands on the host wafer. As the epitaxial transfer will thus result in each of the III-Nitride islands 102i being positioned relative to certain features on the host wafer 110 (e.g., electrical features, etc.), integration of the III-Nitride islands 102i in the manner described herein enables desired integrated chip functions (e.g., optical input/output (I/O) at edge of chip, etc.) to be realized in select regions of the host wafer 110.

Figure 1H:
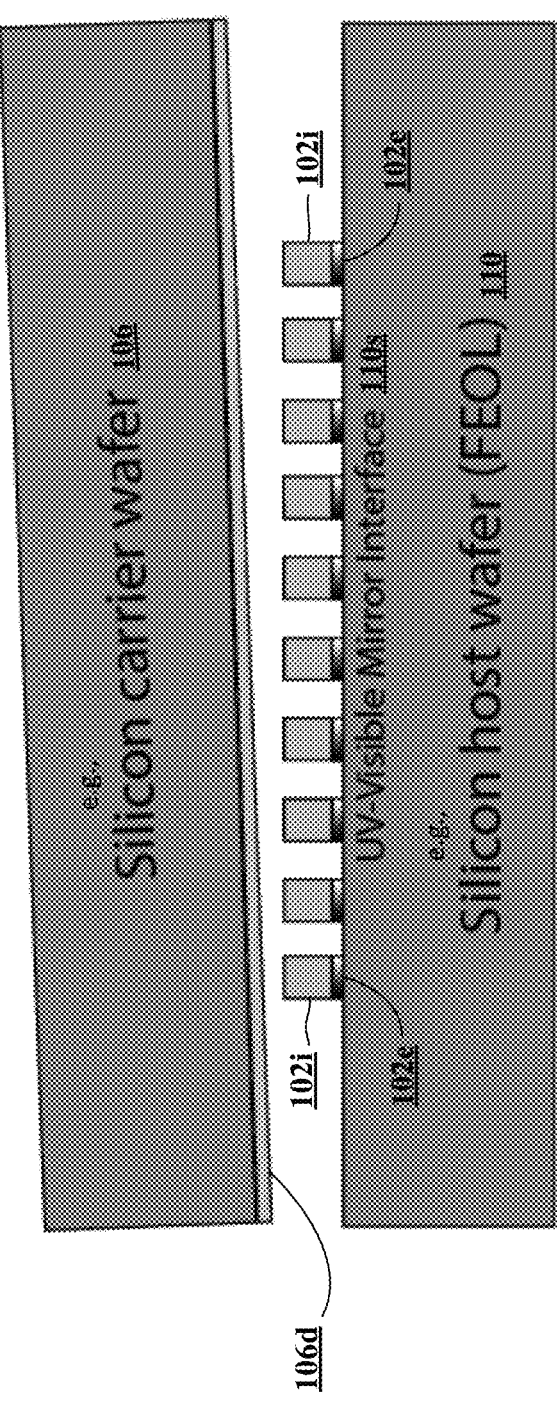

In exemplary embodiments, the array of III-Nitride islands 102i may be (e.g., permanently) bonded to a surface 110s of the host wafer 110 via a metal eutectic bond—e.g., eutectic bond(s) 102e shown in FIG. 1H—that serves as a mirror-bond layer. This mirror-bond layer may provide a high-reflection, optical plane that facilitates improved light emission or absorption by resulting optoelectronic devices fabricated using the construction. In various embodiments, the mirror-bond layer (or respective eutectic bond portions 102e) may be self-aligning and may be contained (or may exist) only adjacent to, or under, the III-Nitride islands 102i.

In one or more embodiments, the metal eutectic bond may be formed by applying heat at a eutectic temperature/point associated with the materials of the metal layer portions 102m and the host wafer 110, and subsequently permitting the materials to cool below the point. In a case where the metal layer portions 102m are composed of aluminum and the host wafer 110 is composed of silicon, the metal eutectic bond may be an Al—Si metal eutectic bond formed by applying heat at about 577° C. (e.g., 600° C.). As shown by reference number 165 of FIG. 1G, which illustrates a phase diagram of an aluminum-silicon system, the metal-eutectic point (defined as the transition from full solidus to full liquidus of aluminum-silicon) may be at 577° C. with 12.2% atomic percent silicon and 87.8% atomic percent aluminum.

In certain alternate embodiments, other metallization schemes may be employed for forming eutectic or peritectic bonds. For instance, in some embodiments, a (e.g., metal) material different from that of the metal layer portions 102m—may be deposited onto the host wafer 110 and used to form eutectic or peritectic bond(s) with the metal layer portions 102m. Examples of such eutectic or peritectic bonds can include In—Pd bonds, Al—Ge bonds, or the like.

With reference to FIGS. 1G and 1H, remaining bonding polymer portions 108i may be removed (e.g., using any suitable technique, such as an oxygen-based dry-etch process), and the carrier wafer 106 may be separated from the III-Nitride islands 102i. The III-Nitride islands 102i may then be exposed (as shown in FIG. 1H) and ready for further processing—e.g., planarization and/or patterning to define individual optoelectronic devices.

Figure 1J:
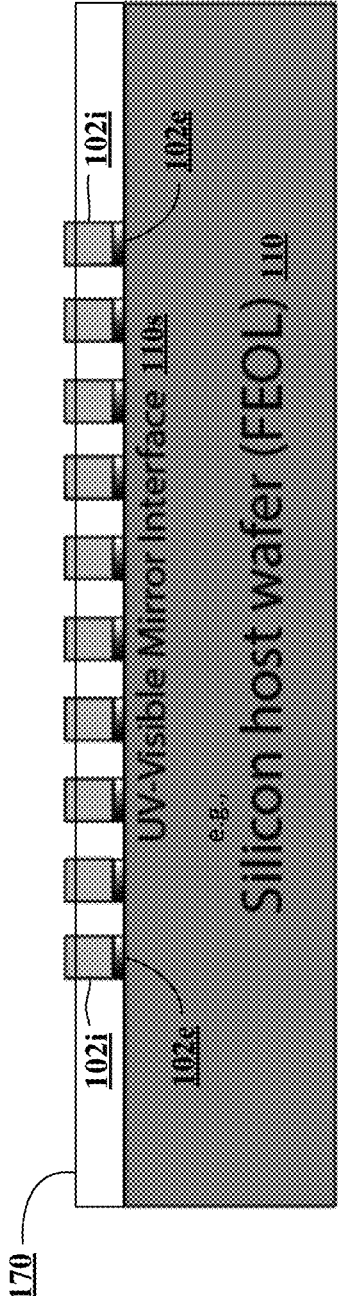

In one or more embodiments, the epitaxial material may (e.g., optionally) be planarized using one or more planarization polymers 170 (FIG. 1J). Device patterning may be performed (e.g., involving liftoff and/or metal deposition) to define individual photonic pixel devices on the III-Nitride islands. Each island may be processed into a single pixel device or a multiple-pixel device.

In exemplary embodiments, subsequent to completing epitaxial bonding and transfer for a first array of III-Nitride islands (e.g., islands 102i of FIG. 1J), additional iterations of epitaxial bonding and epitaxial transfer (e.g., the same as, or similar to, that described above with respect to one or more of FIGS. 1A-1H and 1J) may be performed to define one or more additional III-Nitride island arrays (e.g., having the same material as the first array or different materials therefrom) as needed. In these embodiments, the first array of III-Nitride islands may or may not yet be planarized and processed into pixel devices, and epitaxial bonding and epitaxial transfer may be iterated for each additional set of III-Nitride islands, where the additional III-Nitride islands may be bond-aligned to the overall grid (on the host wafer 110) complementarily with the first array.

It will be appreciated and understood that the formation of the various III-Nitride islands into (e.g., individual) devices can enable development of a vast range of optoelectronic devices, including, for instance, those for chip-to-chip communications, LiFi communications, quantum information processing, and so on. For instance, some or all of the steps of epitaxial bonding and epitaxial transfer may be repeated for different arrangements of III-Nitride islands—e.g., to obtain different spectral wavelength channels. Implementing different wavelength channels may be important for certain applications, such as LiFi communication systems.

Figures 2A, 2B:
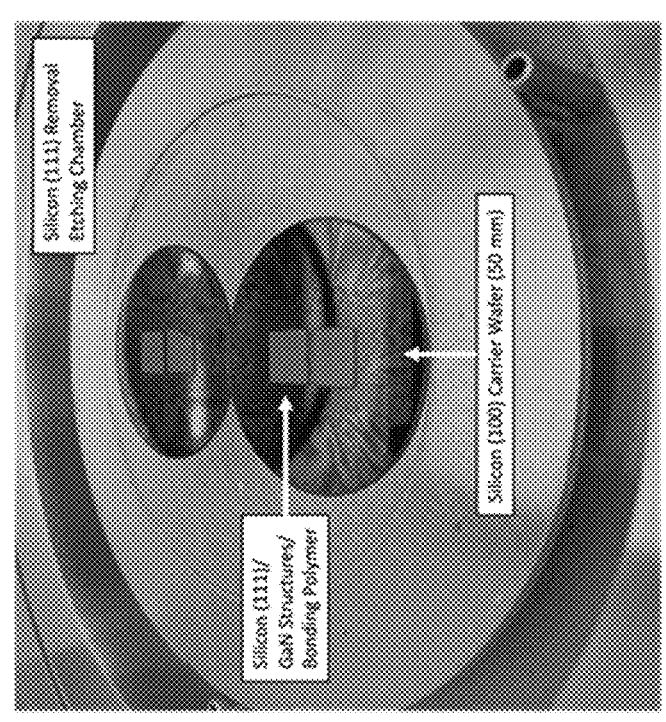
FIG. 2A is an image of an example assembly of large-area bulk III-Nitride chiplets on a silicon carrier wafer in accordance with various aspects described herein.
FIG. 2B is a cross-sectional diagram of example III-Nitride materials before and after substrate removal in accordance with various aspects described herein.

FIG. 2A is an image of an example assembly 200 of large-area bulk III-Nitride chiplets on a silicon carrier wafer in accordance with various aspects described herein. As shown in FIG. 2A, thinning and removal of a bulk silicon <111> substrate may be performed in unison, leaving (e.g., only) the III-Nitride epitaxial layers <0001> below. This may be followed by conversion of the large area epitaxial layers into lithographically-defined III-Nitride Islands. FIG. 2B is a cross-sectional diagram 250 of example III-Nitride materials before and after substrate removal in accordance with various aspects described herein. In the example construction shown in FIG. 2B, the III-Nitride epitaxial layers may include an AlGaN buffer layer used to nucleate growth of the III-Nitride layers on the silicon substrate. It is to be appreciated and understood that embodiments described herein can involve any type of growth of III-Nitride materials. For instance, rather than growing/depositing wurtzite (or hexagonal) material (e.g., GaN), growth can instead be cubic—e.g., cubic GaN.

Figure 3:
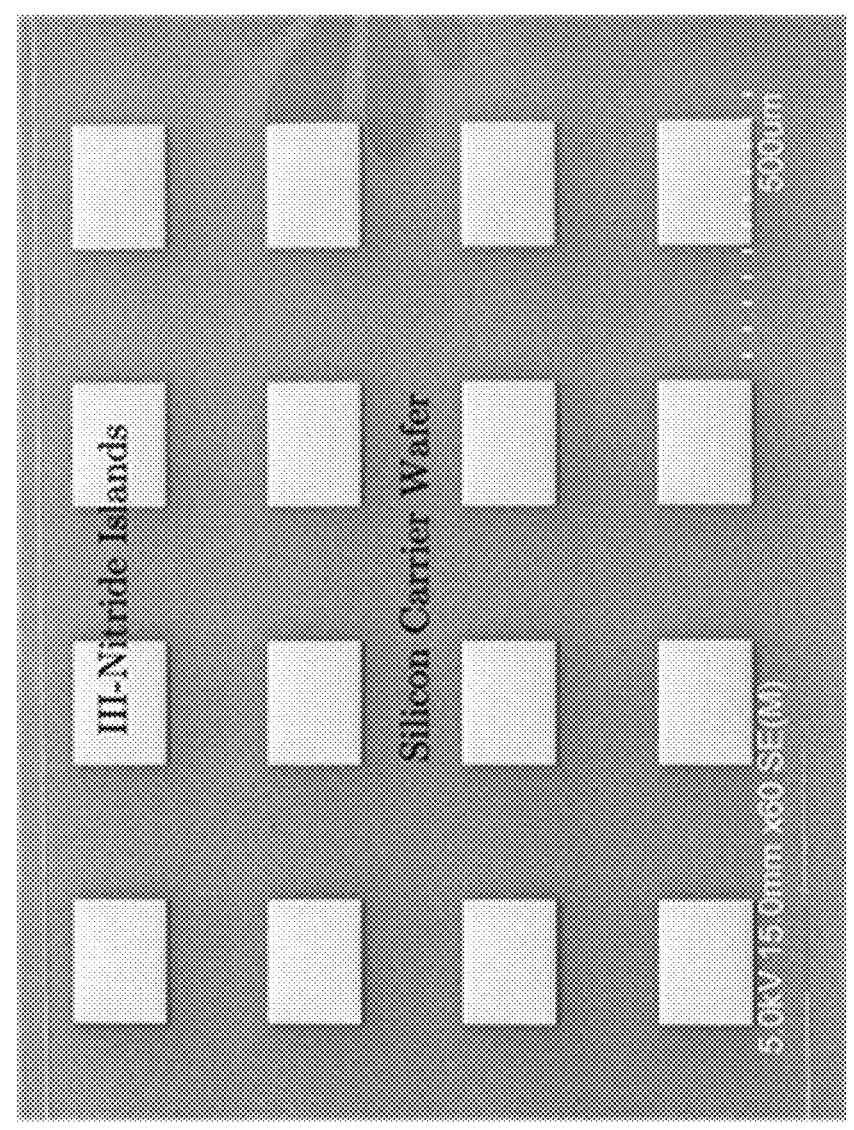
FIG. 3 is a scanning electron micrograph of a result of an example epitaxial bonding process in accordance with various aspects described herein.

FIG. 3 is a scanning electron micrograph 300 of a result of an example epitaxial bonding process in accordance with various aspects described herein. Here, III-Nitride islands may be distributed with fine-alignment using photolithography, where each island may be metallized to form half of a corresponding metal-eutectic bond. Any residue present between islands may be related to sputtering from removal of excess III-Nitride material during island formation, and may not (e.g., does not) transfer off of the carrier wafer.

Figure 4:
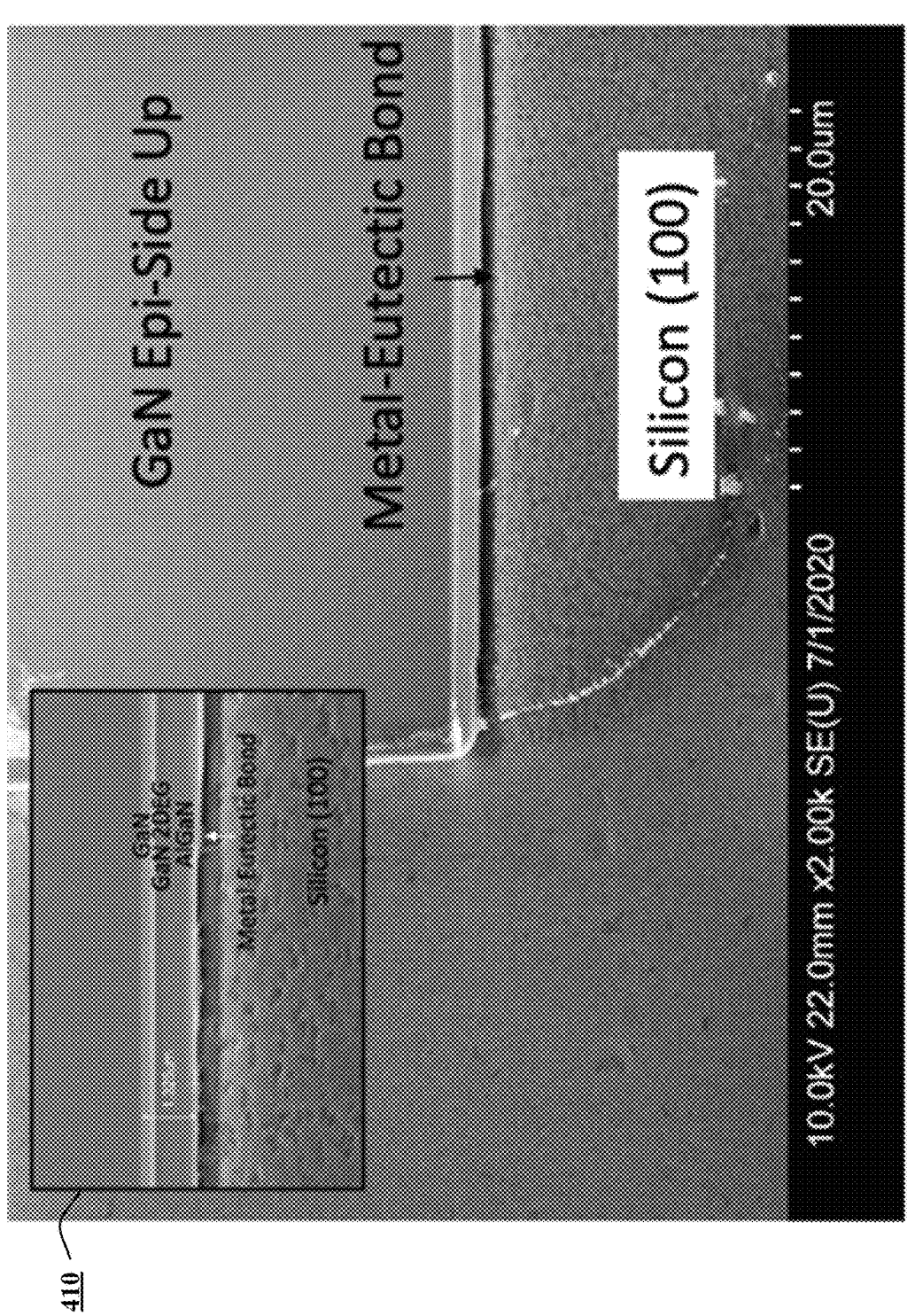
FIG. 4 is a scanning electron micrograph of a result of an example epitaxial bonding and transfer process involving GaN high-electron-mobility transistor (HEMT) epitaxial structures in accordance with various aspects described herein.

FIG. 4 is a scanning electron micrograph 400 of a result of an example epitaxial bonding and transfer process involving GaN high-electron-mobility transistor (HEMT) epitaxial structures in accordance with various aspects described herein. As shown in FIG. 4, III-Nitride epitaxial layers may be bonded to a silicon <100> host wafer (e.g., face-up), and bonding polymer may be removed. Inset 410 shows a magnified view of the epitaxial layer design, illustrating the close proximity of the metal-eutectic bond which can function as a high-reflectivity mirror.

FIGS. 5A-5D are diagrams illustrating, among other things, an example process flow of heterogeneous (e.g., island/pixel) alignment in accordance with various aspects described herein. Here, subsequent to an iteration of epitaxial bonding and epitaxial transfer, a silicon host wafer 510—having been integrated with a first arrangement 502i of metal-eutectically bonded III-Nitride islands (or photonic pixels) (e.g., similar to that described above with respect to FIGS. 1A-1H and 1J)—may receive a second (e.g., complementarily prepared) arrangement 512i of III-Nitride islands (or photonic pixels) on a carrier wafer 516 (e.g., similar to that described above with respect to FIGS. 1A-1F).

Figure 5A:
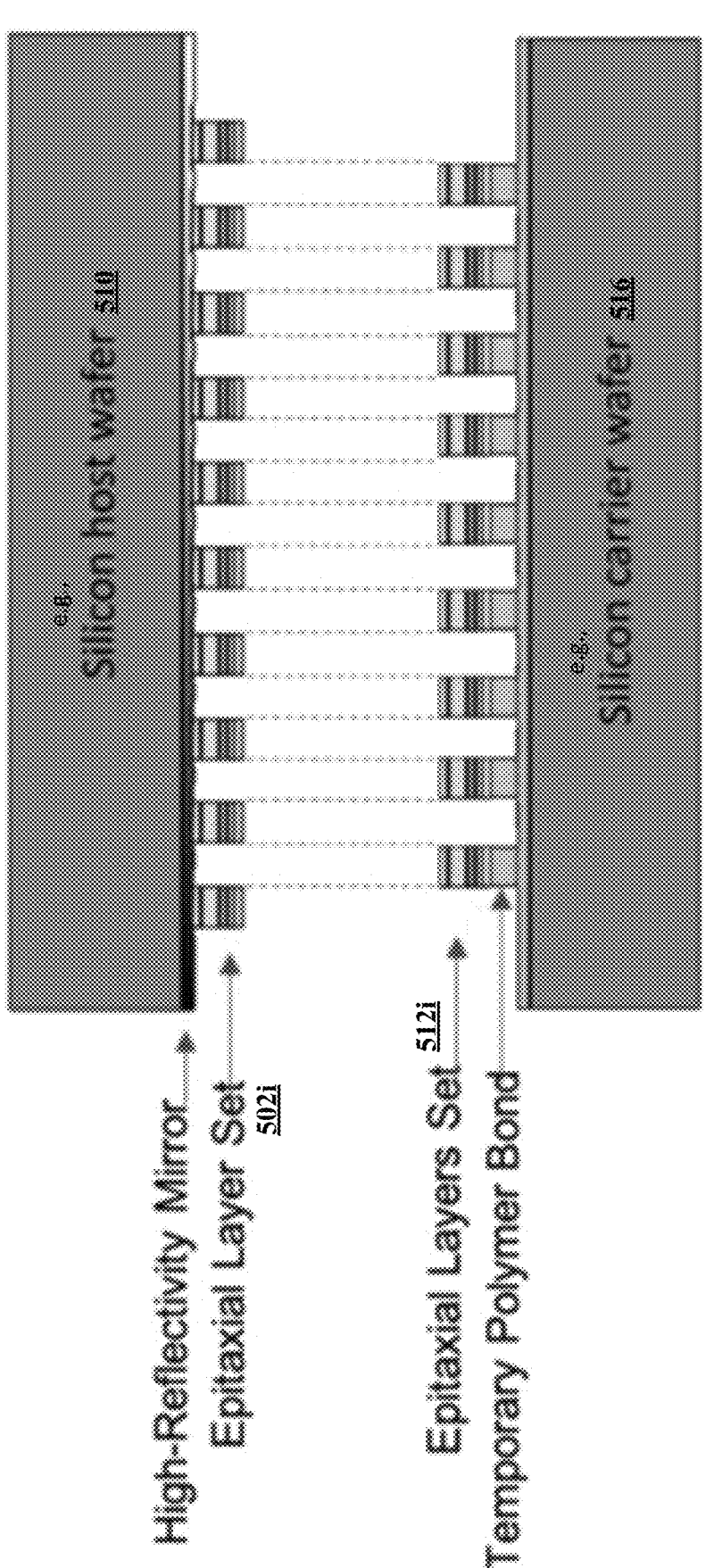
FIGS. 5A-5D are diagrams illustrating, among other things, an example process flow of heterogeneous island/pixel alignment in accordance with various aspects described herein.
Figure 5B:
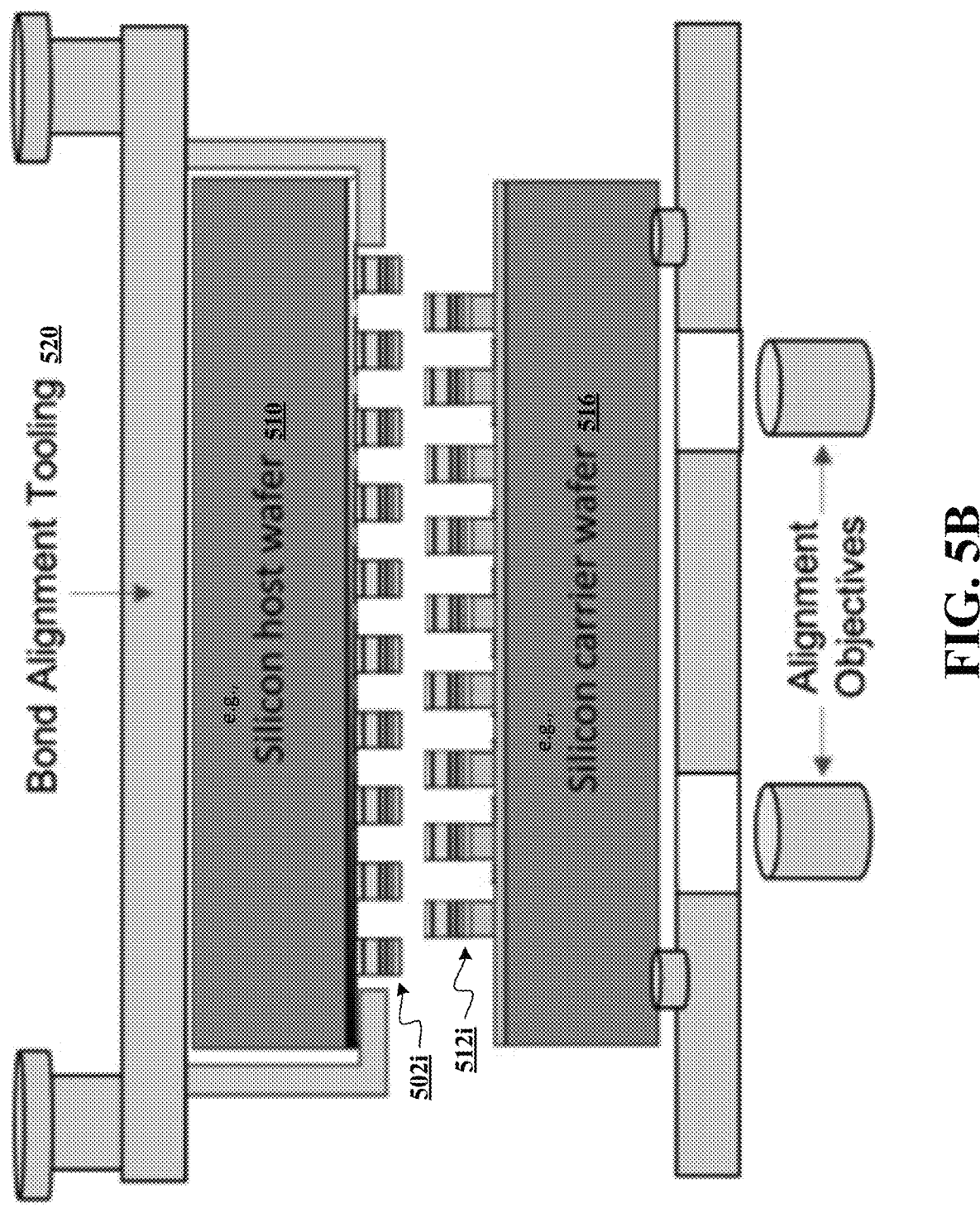
Figure 5C:
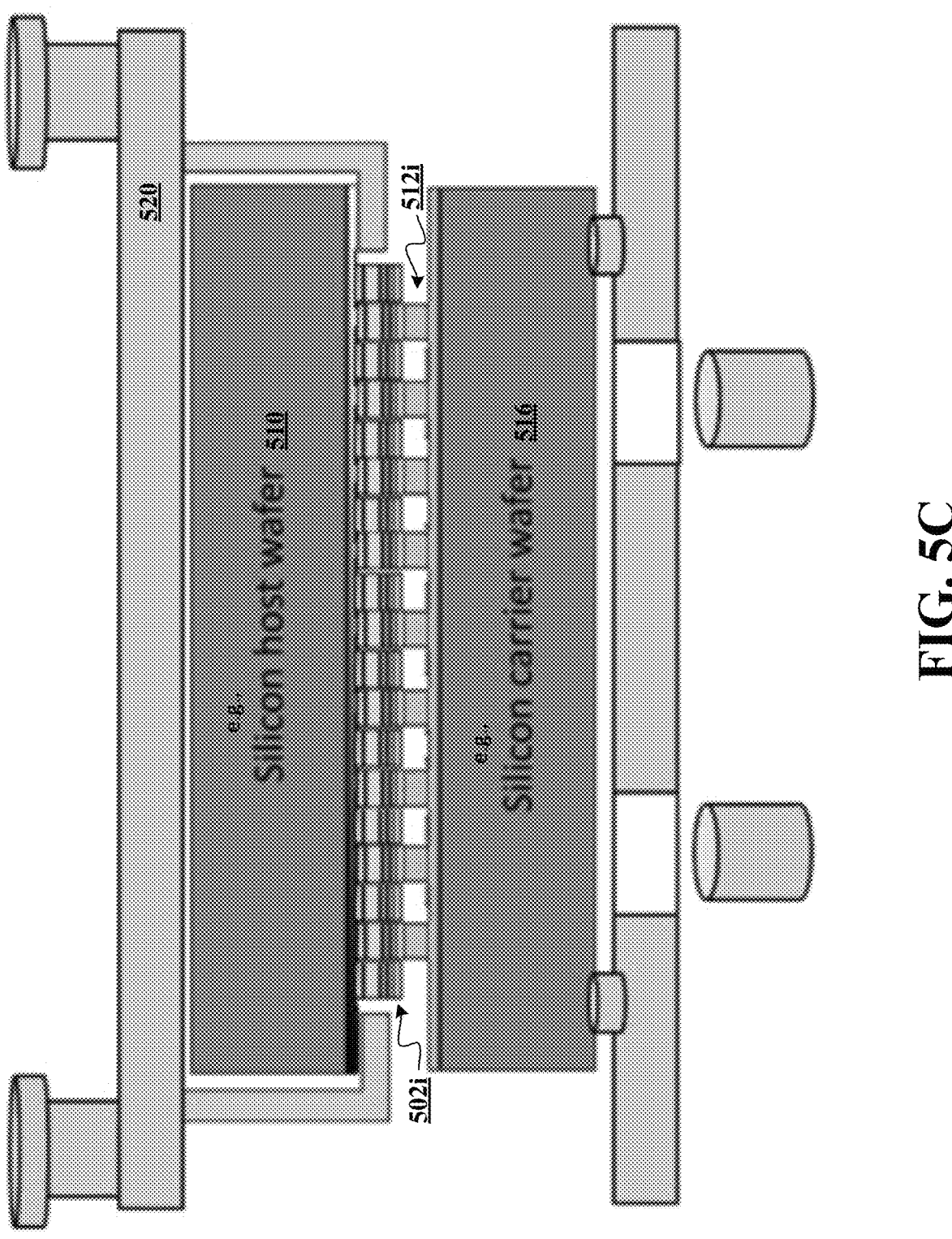
Figure 5D:
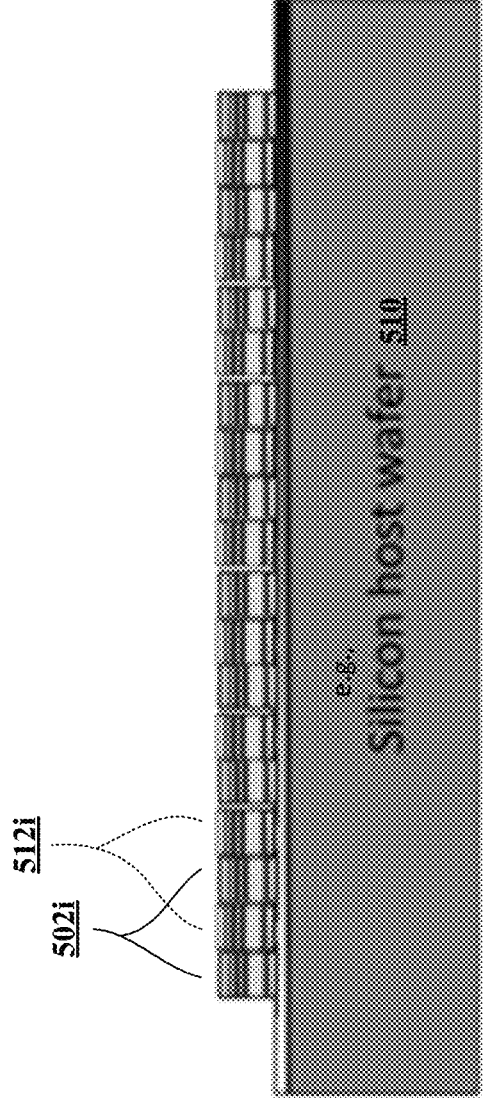

As shown in FIGS. 5B and 5C, heterogenous alignment may be performed using a bond alignment tool 520, which may be configured to provide optical alignment of the two arrangements (502i and 512i) of III-Nitride islands. In various embodiments, bond alignment may involve optical-based detection of alignment features of each of the two wafers 510 and 516 and movement of one or more of the two wafers 510 and 516 relative to one another based on detected positions of the alignment features. The second arrangement (512i) of III-Nitride islands may then be bonded or fastened—e.g., via metal eutectic bonding—to the host wafer 510 (see FIG. 5D). In one or more embodiments, various of the III-Nitride islands 502i and 512i may then be (e.g., substantially simultaneously) processed into photonic pixels (e.g., vertical emitters/detectors) as needed.

Figure 6A:
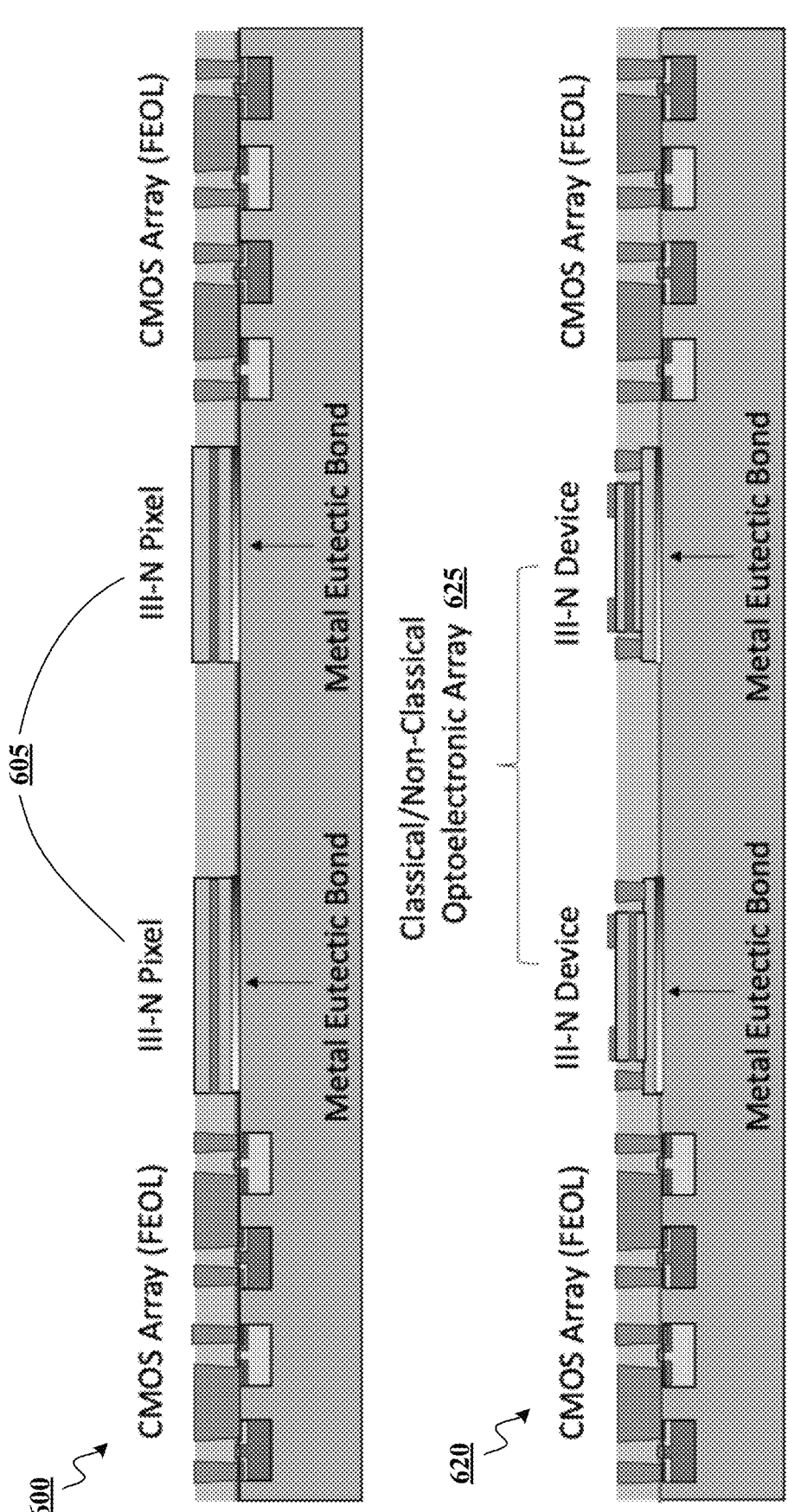
FIGS. 6A and 6B are diagrams illustrating, among other things, cross-sectional views of example III-Nitride optoelectronics embedded in/on a complementary metal-oxide-semiconductor (CMOS) platform for full electronic controls on a silicon substrate in accordance with various aspects described herein.
Figure 6B:
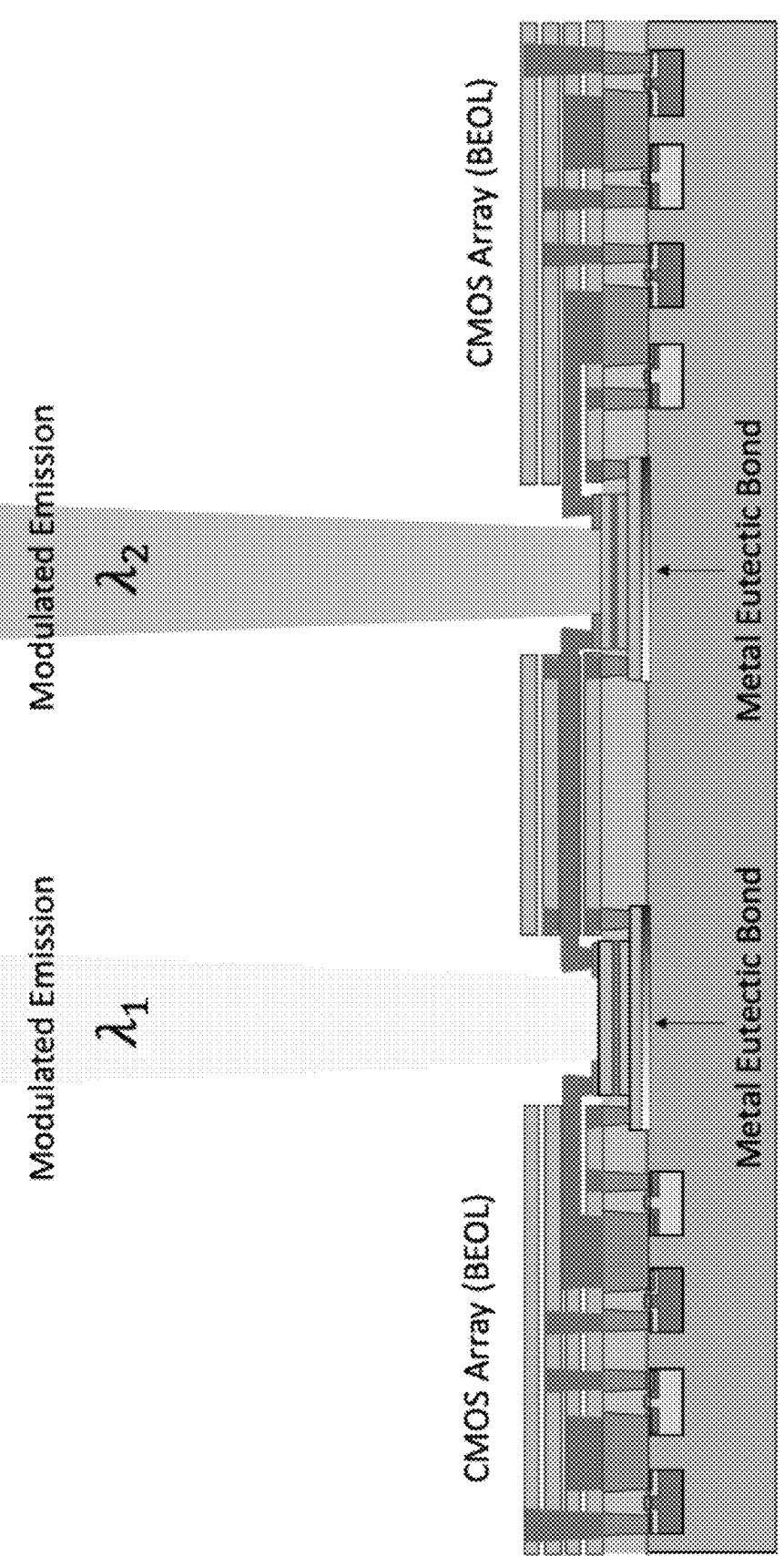

FIGS. 6A and 6B are diagrams 600, 620, and 640 illustrating, among other things, cross-sectional views of example III-Nitride optoelectronics embedded in/on a CMOS platform for full electronic controls on a silicon substrate in accordance with various aspects described herein. Metal-eutectic bonding, which unites individual III- Nitride pixels with the silicon (CMOS) host wafer, is shown in each of diagrams 600, 620, and 640. As shown by reference number 600, an example array of III-Nitride pixels 605, each of which may be designed to operate at the same or different optical wavelengths, may be bonded onto an FEOL-processed CMOS substrate. As shown by reference number 620, an example array of III-Nitride pixels 625 may be fabricated (e.g., during post-processing) to enable multi-wavelength emission for either classical (e.g., LED, etc.) or non-classical (e.g., quantum) optics. As shown by reference number 640 of FIG. 6B, example III-Nitride devices may be interconnected into a (e.g., fully) back end of line (BEOL)-processed CMOS platform, enabling full electronic controls and CMOS-driven optoelectronic modulation circuitry.

Figure 7:
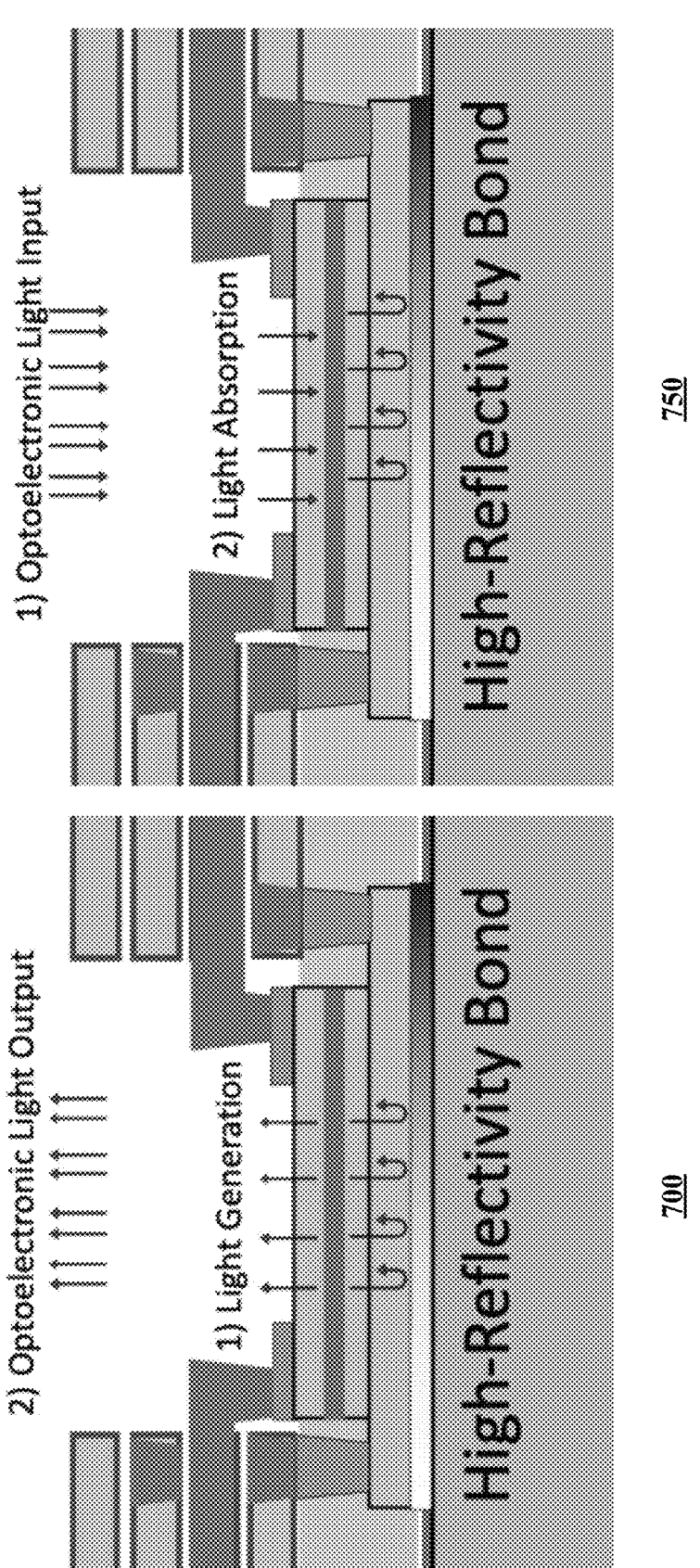
FIG. 7 shows diagrams illustrating, among other things, partial cross-sectional views of example integrated metal-eutectic bond interface(s) serving as a high-reflectance mirror for broad spectrum in accordance with various aspects described herein.

FIG. 7 shows diagrams illustrating, among other things, partial cross-sectional views 700 and 750 of example integrated metal-eutectic bond interface(s) serving as a high-reflectance mirror for broad spectrum in accordance with various aspects described herein. As shown in FIG. 7, the reflecting surface of a eutectic bond enables integrated III-Nitride optoelectronics to support improved light generation (700) or light absorption (750), as less light is captured and lost into the silicon substrate underneath. In cases where heterogeneous integration is performed as described herein and a resulting integrated chip is fabricated to include one or more pixels that emit light and one or more pixels that detect/absorb light for chip-to-chip communications, high reflectivity of the metal-eutectic bond(s) can provide for multiple (e.g., two) passes through the absorptive material, thereby improving light absorption efficiency.

Figure 8:
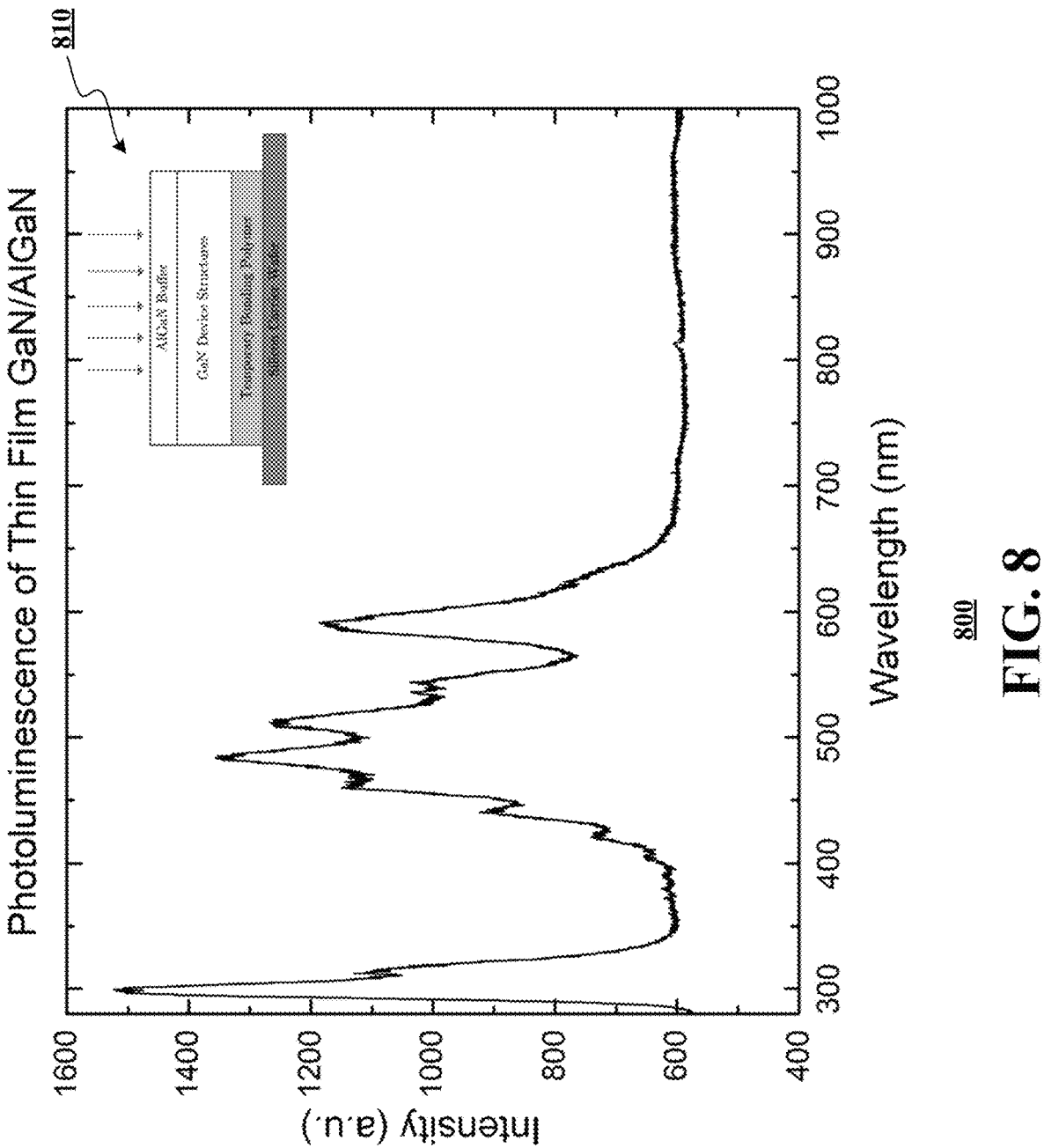
FIG. 8 is a graphical representation illustrating photoluminescence of example III-Nitride layers after full silicon substrate removal in accordance with various aspects described herein.

FIG. 8 is a graphical representation 800 illustrating photoluminescence of example III-Nitride layers after full silicon substrate removal in accordance with various aspects described herein. Here, the ultraviolet photoluminescence spectrum is indicative that AlGaN buffer material is exposed, and thus underlying III-Nitride materials luminesce. It will be appreciated and understood that, should any silicon <111> substrate remain over the AlGaN buffer material, that silicon substrate would have otherwise absorbed this spectrum and prevented the characteristic spectrum shown. The photoluminescence shown confirms that the integration process fully removes the silicon substrate. Inset 810 shows an example implementation in which a high-energy (e.g., 267 nm ultraviolet light) optical source is used to excite the III-Nitride material surface for the photoluminescence measurement.

Figure 9:
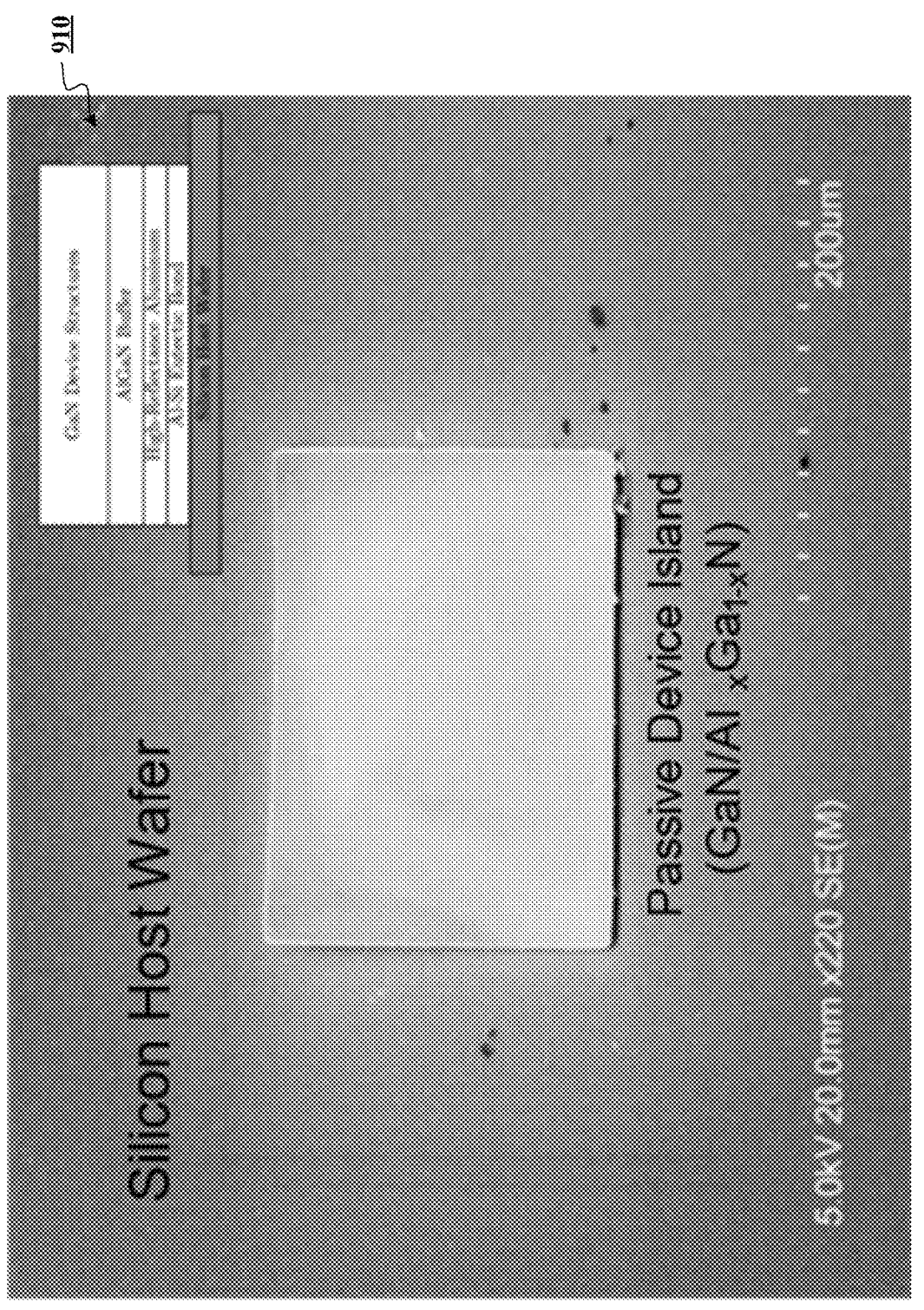
FIG. 9 is a scanning electron micrograph of example epitaxially-transferred III-Nitride islands using an Al—Si eutectic in accordance with various aspects described herein.

FIG. 9 is a scanning electron micrograph 900 of example epitaxially-transferred III-Nitride islands using an Al—Si eutectic. Inset 910 shows a cross-sectional view of an example III-Nitride device material (after epitaxial transfer) on the Al—Si eutectic bond, in accordance with various aspects described herein.

In this way, embodiments described herein provide for the design and fabrication of photonic pixel arrays, where various III-Nitride semiconductors (e.g., GaN, AlxGa1-xN, and/or InxGa1-xN) may be heterogeneously integrated onto a (e.g., silicon <100>) CMOS electronics platform in a scalable and iterative manner to produce a distribution of devices directly controllable by embedded CMOS-based circuitry. This integration process can bring together various III-Nitride epitaxial structures that are optically active at different wavelengths across the full ultraviolet and visible spectrums. The resulting array of the photonic pixels can be electronically controlled by the common CMOS substrate, enabling modulation schemes of each III-Nitride-based device, such as: white light emission, ultraviolet (germicidal) light emission, visible light communication transceivers ("LiFi"), and/or quantum information optoelectronics in the ultraviolet. As part of fabrication, (e.g., each) fine-aligned array of various III-Nitride islands may be metal-eutectically bonded to the electronics (e.g., silicon <100>) substrate, where the metal eutectic layer may mechanically secure the pixel array, act as a thermal path to the silicon substrate, create an electrical interconnect between the CMOS and optoelectronic planes (which allows for improved control over the optoelectronic array), and/or produce a high-reflectivity (e.g., over 90% reflectivity) metal mirror for more efficient or improved light emission/collection that spans the full visible and ultraviolet spectrums.

FIG. 10 depicts an illustrative embodiment of a method 1000 in accordance with various aspects described herein. In certain embodiments, the method may include steps that are similar to or the same as aspects described above with respect to various of FIGS. 1A-1H, 1J, 2A, 2B, 3, 4, 5A-5D, 6A, 6B, and 7-9.

At 1001, the method can include bonding one or more III-Nitride epitaxial layers to a carrier wafer, wherein the one or more III-Nitride epitaxial layers are grown on a non-native substrate. For example, the method can, similar to that described above with respect to FIG. 1A, include bonding one or more III-Nitride epitaxial layers to a carrier wafer, where the one or more III-Nitride epitaxial layers are grown on a non-native substrate.

At 1002, the method can include, after the bonding, removing at least a portion of the non-native substrate from the one or more III-Nitride epitaxial layers. For example, the method can, similar to that described above with respect to FIG. 1C, include, after the bonding, removing at least a portion of the non-native substrate from the one or more III-Nitride epitaxial layers.

At 1003, the method can include processing the one or more III-Nitride epitaxial layers to derive an array of III-Nitride islands. For example, the method can, similar to that described above with respect to FIG. 1D, include processing the one or more III-Nitride epitaxial layers to derive an array of III-Nitride islands.

At 1004, the method can include establishing a metal layer over the array of III-Nitride islands, resulting in an array of metal-coated III-Nitride islands. For example, the method can, similar to that described above with respect to FIG. 1F, include establishing a metal layer over the array of III-Nitride islands, resulting in an array of metal-coated III-Nitride islands.

At 1005, the method can include arranging the carrier wafer relative to a host wafer to position the array of metal-coated III-Nitride islands on a surface of the host wafer. For example, the method can, similar to that described above with respect to FIG. 1G, include arranging the carrier wafer relative to a host wafer to position the array of metal-coated III-Nitride islands on a surface of the host wafer.

At 1006, the method can include causing the array of metal-coated III-Nitride islands and the surface of the host wafer to eutectically bond. For example, the method can, similar to that described above with respect to FIGS. 1G/1H, include causing the array of metal-coated III-Nitride islands and the surface of the host wafer to eutectically bond.

At 1007, the method can include removing the carrier wafer to yield an integrated arrangement of III-Nitride islands on the host wafer. For example, the method can, similar to that described above with respect to FIG. 1H, include removing the carrier wafer to yield an integrated arrangement of III-Nitride islands on the host wafer.

While for purposes of simplicity of explanation, the respective processes are shown and described as a series of blocks in FIG. 10, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Any use of the terms "first," "second," and so forth, in the claims, unless otherwise clear by context, is for clarity only and doesn't otherwise indicate or imply any order in time. For instance, "a first determination," "a second determination," and "a third determination" does not indicate or imply that the first determination is to be made before the second determination, or vice versa, etc.

While various components have been illustrated as separate components, it will be appreciated that multiple components can be implemented as a single component, or a single component can be implemented as multiple components, without departing from example embodiments.

Unless otherwise explained, all technical and scientific terms used herein have the same meaning as commonly understood by one of ordinary skill in the art to which a disclosed disclosure belongs. In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, "comprising" is synonymous with "including," "containing," or "characterized by," and is inclusive or open-ended and does not exclude additional, unrecited elements or method steps. For instance, "comprising A or B" means "including A" or "including B" or "including A and B." As used herein, "consisting of" excludes any element, step, or ingredient not specified in the aspect element. As used herein, "consisting essentially of" does not exclude materials or steps that do not materially affect the basic and novel characteristics of the aspect. In each instance herein any of the terms "comprising", "consisting essentially of" and "consisting of" may be replaced with either of the other two terms. The disclosure illustratively described herein suitably may be practiced in the absence of any element or elements, limitation or limitations which is not specifically disclosed herein.

As may also be used herein, the term(s) "operably coupled to," "coupled to," and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

The disclosure may be further understood by the included non-limiting examples. All references cited herein are hereby incorporated by reference to the extent not inconsistent with the disclosure herewith.

Although the description herein contains many specificities, these should not be construed as limiting the scope of the disclosure, but as merely providing illustrations of some of the presently preferred embodiments of the disclosure. Thus, the scope of the disclosure should be determined by the appended aspects and their equivalents, rather than by the examples given.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the disclosure. Thus, it should be understood that, although the present disclosure has been specifically disclosed by preferred embodiments, exemplary embodiments, and optional features, modification and variation of the concepts herein disclosed may be resorted to by those skilled in the art, and that such modifications and variations are considered to be within the scope of this disclosure as defined by the appended aspects. The specific embodiments provided herein are examples of useful embodiments of the present disclosure and it will be apparent to one skilled in the art that the present disclosure may be carried out using a large number of variations of the devices, device components, and methods steps set forth in the present description. As will be obvious to one of skill in the art, methods and devices useful for the present methods can include a large number of optional composition and processing elements and steps. Accordingly, the embodiments disclosed and/or claimed herein are intended to embrace all such modifications and variations that fall within the spirit and scope of the appended claims.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the aspects herein.

Although the present disclosure has been described with reference to certain embodiments thereof, other embodiments are possible without departing from the present disclosure. The spirit and scope of the appended aspects should not be limited, therefore, to the description of the preferred embodiments contained herein. All embodiments that come within the meaning of the aspects, either literally or by equivalence, are intended to be embraced therein. Furthermore, the advantages described above are not necessarily the only advantages of the disclosure, and it is not necessarily expected that all of the described advantages will be achieved with every embodiment of the disclosure.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative (rather than in a restrictive) sense.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:

bonding one or more III-Nitride epitaxial layers to a carrier wafer, wherein the one or more III-Nitride epitaxial layers are grown on a non-native substrate;

after the bonding, removing at least a portion of the non-native substrate from the one or more III-Nitride epitaxial layers;

processing the one or more III-Nitride epitaxial layers to derive an array of III-Nitride islands;

establishing a metal layer over the array of III-Nitride islands, resulting in an array of metal-coated III-Nitride islands;

arranging the carrier wafer relative to a host wafer to position the array of metal-coated III-Nitride islands on a surface of the host wafer;

causing the array of metal-coated III-Nitride islands and the surface of the host wafer to eutectically bond;

removing the carrier wafer to yield an integrated arrangement of III-Nitride islands on the host wafer;

obtaining a second device that includes a second carrier wafer having a second array of metal-coated III-Nitride islands, wherein the second device is derived according to one or more steps that correspond to one or more of the bonding, the removing of the at least a portion of the non-native substrate, the processing, and the establishing;

using an optical alignment tool to align the second carrier wafer relative to the host wafer to position the second array of metal-coated III-Nitride islands on the surface of the host wafer relative to the integrated arrangement of III-Nitride islands;

causing the second array of metal-coated III-Nitride islands and the surface of the host wafer to eutectically bond; and removing the second carrier wafer, thereby resulting in a further integrated arrangement of III-Nitride islands on the host wafer in which the second array of metal-coated III-Nitride islands is interleaved with the integrated arrangement of III-Nitride islands.

2. The method of claim 1, wherein the arranging the carrier wafer relative to the host wafer comprises epitaxial transferring the array of metal-coated III-Nitride islands, in unison, onto the surface of the host wafer.

3. The method of claim 1, wherein the processing the one or more III-Nitride epitaxial layers comprises performing photolithographic defining and etching to derive the array of III-Nitride islands.

4. The method of claim 1, further comprising planarizing and patterning the integrated arrangement of III-Nitride islands to fabricate photonic pixels.

5. The method of claim 4, wherein the photonic pixels are fabricated to provide functions relating to one or more of white light emission, ultraviolet (UV) light emission, chip-to-chip communications, visible light communications (VLC), and quantum information processing.

6. The method of claim 1, wherein the bonding the one or more III-Nitride epitaxial layers to the carrier wafer is performed via a bonding polymer.

7. The method of claim 6, further comprising, after the bonding the one or more III-Nitride epitaxial layers to the carrier wafer, removing excess portions of the bonding polymer.

8. The method of claim 7, further comprising, after the processing the one or more III-Nitride epitaxial layers to derive the array of III-Nitride islands, removing additional portions of the bonding polymer based on locations of the III-Nitride islands.

9. The method of claim 8, further comprising removing remaining portions of the bonding polymer to enable removal of the carrier wafer.

10. The method of claim 1, wherein the one or more steps comprise:

bonding additional III-Nitride epitaxial layers to the second carrier wafer, wherein the additional III-Nitride epitaxial layers are grown on a second non-native substrate;

after the bonding the additional III-Nitride epitaxial layers to the second carrier wafer, removing at least a portion of the second non-native substrate from the additional III-Nitride epitaxial layers;

processing the additional III-Nitride epitaxial layers to derive a second array of III-Nitride islands; and establishing a second metal layer over the second array of III-Nitride islands, resulting in the second array of metal-coated III-Nitride islands.

11. A heterogenous integration process, comprising:

epitaxially bonding wide band gap semiconductor materials with a silicon carrier wafer, wherein the wide band gap semiconductor materials are grown on a non-native substrate;

removing the non-native substrate from the wide band gap semiconductor materials;

defining and deriving an array of wide band gap semiconductor islands;

establishing a metal layer over the array of wide band gap semiconductor islands, resulting in an array of metal-coated wide band gap semiconductor islands;

epitaxially transferring the array of metal-coated wide band gap semiconductor islands to a surface of a host wafer;

forming a eutectic bond between the array of metal-coated wide band gap semiconductor islands and the surface of the host wafer, wherein one or more metal layer portions of the eutectic bond function as a mirror that provides reflectivity spanning a visible spectrum and an ultraviolet (UV) spectrum;

removing the silicon carrier wafer;

obtaining a second device that includes a second silicon carrier wafer having a second array of metal-coated wide band gap semiconductor islands, wherein the second device is derived according to one or more steps that correspond to one or more of the bonding, the removing of the non-native substrate, the defining and deriving, and the establishing;

using an optical alignment tool to align the second silicon carrier wafer relative to the host wafer to position the second array of metal-coated wide band gap semiconductor islands on the surface of the host wafer relative to the array of metal-coated wide band gap semiconductor islands;

causing the second array of metal-coated wide band gap semiconductor islands and the surface of the host wafer to eutectically bond; and removing the second silicon carrier wafer, thereby resulting in an integrated arrangement of wide band gap semiconductor islands on the host wafer in which the second array of metal-coated wide band gap semiconductor islands is interleaved with the array of metal-coated wide band gap semiconductor islands.

12. The heterogenous integration process of claim 11, wherein the wide band gap semiconductor materials comprise III-Nitride epitaxial materials.

13. The heterogenous integration process of claim 11, wherein the metal layer is composed of aluminum.

14. The heterogenous integration process of claim 13, wherein the eutectic bond comprises an aluminum-silicon eutectic bond.

15. The heterogenous integration process of claim 11, wherein eutectic bonding between the array of wide band gap semiconductor islands and the surface of the host wafer mechanically secures the array of wide band gap semiconductor islands to the host wafer, and forms one or more electrical interconnects for complementary metal-oxide-semiconductor (CMOS) and optoelectronic planes.

16. An integration method, comprising:

epitaxially bonding III-Nitride materials with a silicon carrier wafer, wherein the III-Nitride materials are grown on a non-native substrate;

removing the non-native substrate from the III-Nitride materials;

defining and deriving an array of III-Nitride islands;

establishing a metal layer over the array of III-Nitride islands, resulting in an array of metal-coated III-Nitride islands;

epitaxially transferring the array of metal-coated III-Nitride islands to a surface of a host wafer;

forming a eutectic bond between the array of metal-coated III-Nitride islands and the surface of the host wafer, thereby mechanically securing the array of metal-coated III-Nitride islands to the host wafer;

removing the silicon carrier wafer to yield an integrated arrangement of III-Nitride islands on the host wafer;

obtaining a second device that includes a second silicon carrier wafer having a second array of metal-coated III-Nitride islands, wherein the second device is derived according to one or more steps that correspond to one or more of the bonding, the removing, the defining and deriving, and the establishing;

using an alignment tool to align the second silicon carrier wafer relative to the host wafer to position the second array of metal-coated III-Nitride islands on the surface of the host wafer relative to the integrated arrangement of III-Nitride islands;

causing the second array of metal-coated III-Nitride islands and the surface of the host wafer to eutectically bond; and removing the second silicon carrier wafer, thereby resulting in a further integrated arrangement of III-Nitride islands on the host wafer in which the second array of metal-coated III-Nitride islands is interleaved with the integrated arrangement of III-Nitride islands.

17. The integration method of claim 16, wherein the epitaxially transferring involves epitaxially transferring the array of metal-coated III-Nitride islands, in unison, onto the surface of the host wafer.

18. The integration method of claim 16, wherein the metal layer is composed of aluminum.

19. The integration method of claim 18, wherein the eutectic bond comprises an aluminum-silicon eutectic bond.

20. The integration method of claim 16, wherein eutectic bonding between the array of metal-coated III-Nitride islands and the surface of the host wafer forms one or more electrical interconnects for complementary metal-oxide-semiconductor (CMOS) and optoelectronic planes, and functions as a mirror that provides reflectivity spanning a visible spectrum and an ultraviolet (UV) spectrum.

* * * * *